United States Patent
Nakamura

(10) Patent No.: US 6,555,481 B2
(45) Date of Patent: Apr. 29, 2003

(54) SEMICONDUCTOR DEVICE AND ITS MANUFACTURE

(75) Inventor: Shunji Nakamura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/748,013

(22) Filed: Dec. 27, 2000

(65) Prior Publication Data

US 2001/0005033 A1 Jun. 28, 2001

(30) Foreign Application Priority Data

Dec. 28, 1999 (JP) .......................................... 11-374722

(51) Int. Cl.[7] ...................... H01L 21/302; H01L 21/461
(52) U.S. Cl. ...................... 438/734; 438/740; 438/620; 438/637; 438/672
(58) Field of Search .................................. 438/620, 622, 438/624, 633, 637, 672, 734, 740, FOR 111, FOR 355; 430/312

(56) References Cited

U.S. PATENT DOCUMENTS

| 4,795,722 | A | * | 1/1989 | Welch et al. | 148/DIG. 11 |
|---|---|---|---|---|---|
| 5,055,426 | A | * | 10/1991 | Manning | 438/622 |
| 5,484,672 | A | * | 1/1996 | Bajuk et al. | 430/312 |
| 5,895,239 | A | * | 4/1999 | Jeng et al. | 438/239 |
| 6,020,255 | A | * | 2/2000 | Tsai et al. | 438/618 |
| 6,083,824 | A | * | 7/2000 | Tsai et al. | 438/629 |
| 6,242,339 | B1 | * | 6/2001 | Aoi | 427/487 |
| 6,303,272 | B1 | * | 10/2001 | Furukawa et al. | 430/312 |

* cited by examiner

Primary Examiner—George Fourson
Assistant Examiner—Michelle Estrada
(74) Attorney, Agent, or Firm—Armstrong, Westerman & Hattori, LLP

(57) ABSTRACT

A method of manufacturing a semiconductor device including the steps of: (a) forming an interlayer insulating film over a semiconductor substrate; (b) forming a first mask on the interlayer insulating film, the first mask having a plurality of stripe patterns parallel to a first direction, and etching the interlayer insulating film from a surface thereof to a first intermediate depth to form a groove; and (c) forming a second mask on the interlayer insulating film, the second mask having a plurality of stripe patterns parallel to a second direction crossing the first direction, and etching the interlayer insulating film by a remaining thickness thereof in an area corresponding to the groove and not covered with the second mask to form an opening, and in an area other than the area corresponding to the groove to form a second groove reaching a second intermediate depth from a surface of the interlayer insulating film. With this method, an opening having different cross sectional shapes at different depths can be formed with a smaller number of masks.

5 Claims, 24 Drawing Sheets

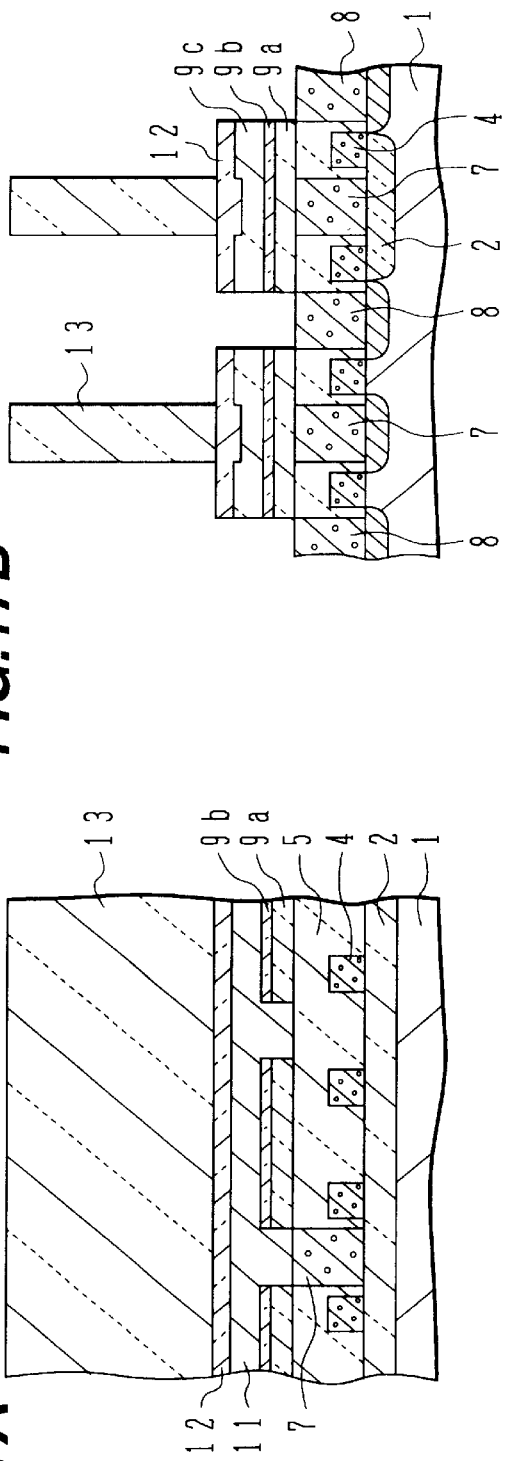
FIG.17A
FIG.17C
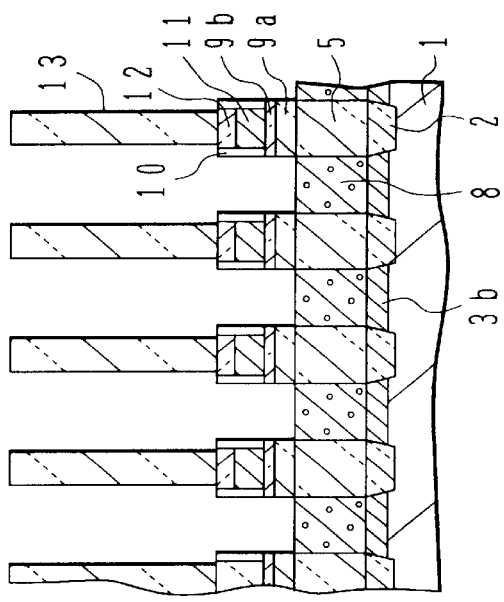
FIG.17B
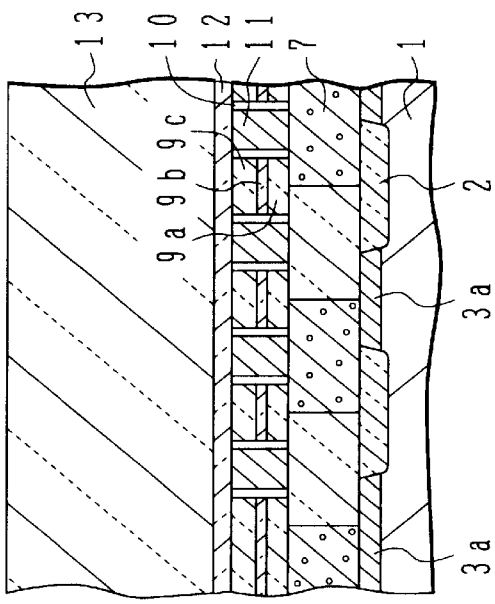
FIG.17D

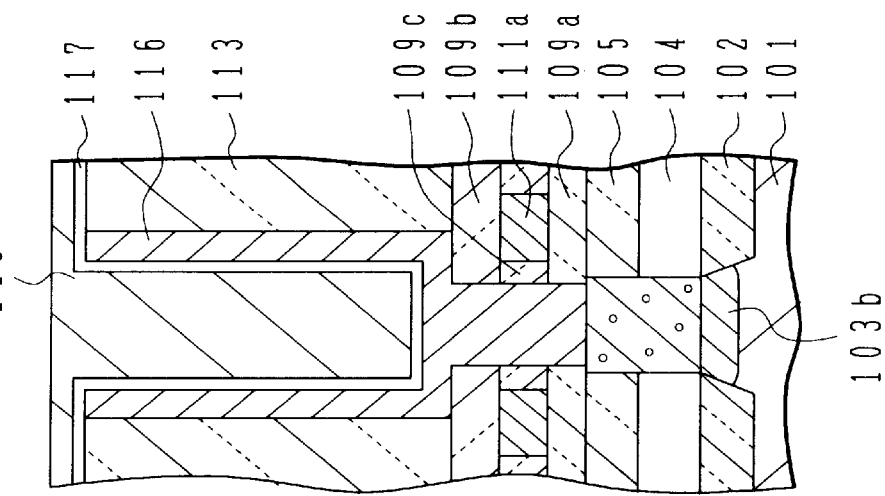
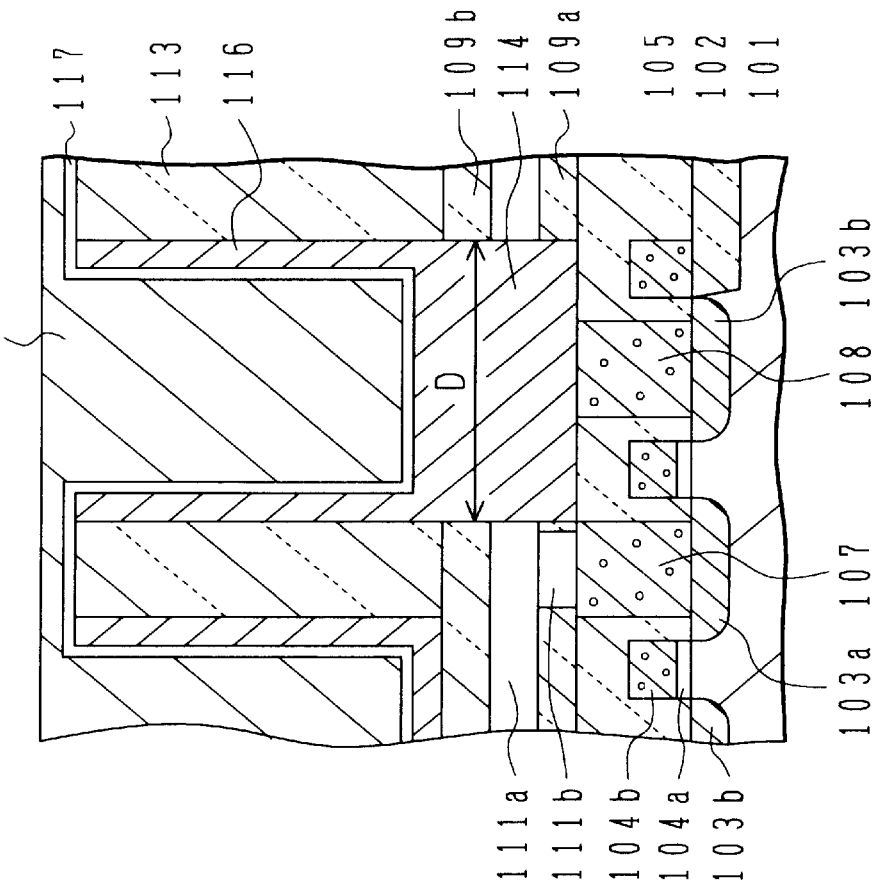
FIG.24B PRIOR ART
FIG.24A PRIOR ART

SEMICONDUCTOR DEVICE AND ITS MANUFACTURE

This application is based on Japanese Patent Application HEI 11-374722, filed on Dec. 28, 1999, the entire contents of which are incorporated herein by reference.

BACKGROUND OF THE INVENTION a) Field of the Invention

The present invention relates to a semiconductor device and its manufacture, and more particularly to a semiconductor device with a multi-layer wiring structure and its manufacture method.

b) Description of the Related Art

Improvements on multi-layer conductive wires are being made along with higher integration of semiconductor integrated circuit devices. Self-aligned contact (SAC) techniques are also adopted to form a contact in a narrow area. There are strong requests for reduction of the manufacturing cost of semiconductor integrated circuit devices. In order to lower the manufacturing cost, it is effective to reduce the number of masks.

FIGS. 23A and 23B show an example of the structure of a dynamic random access memory (DRAM) according to conventional techniques. FIG. 23A is a vertical cross sectional view taken along a direction parallel to a bit line, and FIG. 23B is a vertical cross sectional view taken along a direction perpendicular to the bit line.

A bit line 111a shown in FIG. 23A and an insulated gate electrode (word line) 104 shown in FIG. 23B do not actually appear in these cross sectional views, but are hidden in the background regions. However, these bit line 111a and gate electrode 104 are drawn for purposes of easy understanding.

As shown in FIG. 23A, a shallow trench isolation (STI) region 102 of an oxide film is buried in the surface layer of a p-type region 101 of a semiconductor substrate. The STI region 102 defines or surrounds respective active regions. On the surface of the active region, a gate oxide film and a gate electrode layer are laminated and patterned to form a pair of gate electrode structures each constituted of a gate oxide film 104a and a gate electrode 104b. An etching stopper film of silicon nitride or the like may be formed covering the upper and side surfaces of the insulated gate electrode. By using the gate electrode 104b as a mask, n-type impurity ions are implanted into the exposed active region. As a result, a source/drain region 103a to be connected to the bit line is formed in the central area of the active region, and a pair of source/drain regions 103b to be connected to storage capacitors are formed on both sides of the gate electrodes. A first interlayer insulating film 105 of silicon oxide or the like is formed on the substrate surface, covering the gate electrode.

A resist pattern or the like is formed on the first interlayer insulating film 105, and contact holes to the source/drain regions 103a and 103b are formed through the first interlayer insulating film 105. Thereafter, conductive material such as polysilicon is deposited, and the conductive material on the first interlayer insulating film 105 is removed to leave lower plugs 107 and 108 only in the contact holes.

Thereafter, a second interlayer insulating film 109a of silicon oxide or the like is deposited on the first interlayer insulating film. A mask pattern is formed on the silicon oxide film 109a. A trench is formed through the silicon oxide film 109a in order to form, for example, a bit line. After this mask pattern is removed, another mask pattern is formed having an opening corresponding to a contact area in the bottom area of the trench. By using this other mask pattern, the second interlayer insulating film 109a is etched to form a bit line contact hole. A bit line contact 111b is formed in the bit line contact hole, and a bit line 111a is formed in the bit line trench. These contact 111b and bit line 111a may be made of the same material or different materials.

A third interlayer insulating film 109b is deposited covering the bit line 111a. If SAC techniques are to be incorporated, the upper and side surfaces of the bit line 111a are covered with an etch stopper film.

A resist layer is formed on the surface of the third interlayer insulating film 109b, and an opening is formed through the interlayer insulating films 109a and 109b in an area corresponding to the storage electrode lower plug 108. This opening is buried with a storage capacitor contact 114 to form a surface electrically connected to the source/drain region 103b in the surface of the third interlayer insulating film 109b.

Thereafter, an insulating film 113 of silicon oxide or the like is formed, and a portion of the insulating film 113 where a storage electrode is to be formed, is removed. A storage electrode 116 is deposited, and the storage electrode on the upper surface of the insulting film 113 is removed. The surface of the storage electrode is covered with a capacitor dielectric film 117, and a plate electrode 118 is formed on the capacitor dielectric film 117.

FIG. 23B shows the cross sectional structure perpendicular to that shown in FIG. 23A. The storage electrode contact 114 is formed between a pair of bit lines 111a. As shown in FIG. 23A, by limiting the area occupied by the storage electrode contact 114, a parasitic capacitance between the storage electrode and bit line can be suppressed small.

However, the structure shown in FIGS. 23A and 23B requires two masks, one for forming the storage electrode 116 and the other for forming the storage electrode contact 114.

FIGS. 24A and 24B show the structure of DRAM whose storage electrode and its contact are formed by one mask.

FIG. 24A is a cross sectional view taken along a direction parallel to a bit line 111a, and FIG. 24B is a cross sectional view taken along a direction perpendicular to the bit line 111a. As shown in FIGS. 24A and 24B, in this structure, the same cross sectional shape of a storage electrode 116 extends downward to form a storage electrode contact 114. Therefore, the same mask can be used for forming the storage electrode and storage electrode contact, reducing the number of masks by one.

However, as shown in FIG. 24A, the storage electrode contact 114 extends in parallel to the bit lines 111a in a large area and a parasitic capacitance therebetween increases. If an insulating film 109c formed in contact with the side walls of the bit line 111a is made of material having a large dielectric constant, such as silicon nitride, the parasitic capacitance increases greatly. If the insulating film 109c is made of silicon oxide film, there is no etch selectivity so that electrical shortage is likely to be formed between the storage electrode contact and bit line.

A hole continuous in a depth direction and having different cross sectional shapes generally requires two masks. If such a hole is to be formed by using one mask, it is difficult to control the cross sectional shape of the hole. If the number of masks is increased, the manufacturing cost is difficult to be lowered, whereas if the number of masks is reduced, desired electric characteristics are difficult to be obtained.

SUMMARY OF THE INVENTION

It is an object of the present invention to provide a semiconductor device manufacture method capable of realizing desired electric characteristics by using a smaller number of masks.

It is another object of the present invention to provide a semiconductor device manufacture method capable of forming a hole having different cross sectional shapes in a depth direction by using a smaller number of masks.

It is another object of the present invention to provide a semiconductor device manufacture method capable of reducing a parasitic capacitance by using a smaller number of masks.

It is still another object of the present invention to provide a semiconductor device with a small parasitic capacitance capable of being manufactured with a smaller number of masks.

According to one aspect of the present invention, there is provided a semiconductor device, comprising a semiconductor substrate; a lower structure formed on the semiconductor substrate, the lower structure having a first kind contact surface and a second kind contact surface; an interlayer insulating film formed on the lower structure; a groove formed in the interlayer insulating film from an upper surface to an intermediate depth of the interlayer insulating film, the groove having a bottom above the first kind contact surface; a first kind conductive wire formed in the groove; a first kind opening formed through a remaining thickness of the interlayer insulating film from the bottom of the groove and reaching the first kind contact surface; a first kind conductive member formed in the first kind opening; a mask layer formed in the surface of the interlayer insulating film and on a surface of the first kind conductive wire and having an opening in an area corresponding to the second contact surface, an upper surface of the mask layer being flush with the surface of the interlayer insulating film; a second kind opening reaching the second kind contact surface from the opening of the mask layer; and a second kind conductive member formed in the second kind opening.

According to another aspect of the present invention, there is provided a method of manufacturing a semiconductor device, comprising the steps of: (a) forming an interlayer insulating film over a semiconductor substrate; (b) forming a first mask on the interlayer insulating film, the first mask having a plurality of stripe patterns parallel to a first direction, and etching the interlayer insulating film from a surface thereof to a first intermediate depth to form a groove; and (c) forming a second mask on the interlayer insulating film, the second mask having a plurality of stripe patterns parallel to a second direction crossing the first direction, and etching the interlayer insulating film by a remaining thickness thereof in an area corresponding to the groove and not covered with the second mask to form an opening, and in an area other than the area corresponding to the groove to form a second groove reaching a second intermediate depth from a surface of the interlayer insulating film.

As above, a semiconductor device having a multi-layer structure can be manufactured with a smaller number of masks. A DRAM having a small parasitic capacitance between a bit line and a storage capacitor can be manufactured with a small number of masks.

BRIEF DESCRIPTION OF THE DRAWINGS

FIGS. 13A to 13D, FIGS. 14A to 14D, FIGS. 15A to 15D, FIGS. 16A to 16D, FIGS. 17A to 17D, FIGS. 18A to 18D and FIGS. 19A to 19D are cross sectional views illustrating a semiconductor device manufacture method according to a third embodiment of the invention.

FIGS. 24A and 24B are cross sectional views showing another example of a DRAM structure according to conventional techniques.

DETAILED DESCRIPTION OF THE PREFERRED EMBODIMENTS

FIGS. 1A to 1I briefly illustrate the fundamental concept of the invention.

Figure 1A:
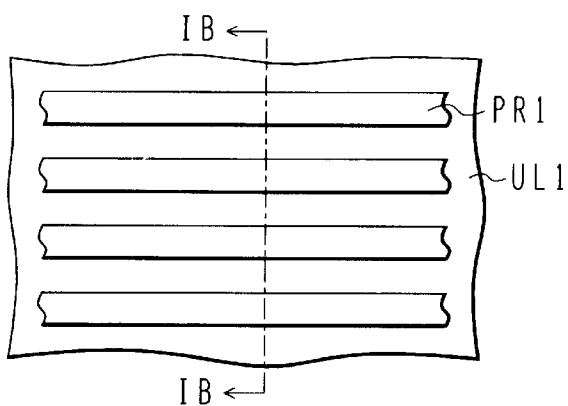
FIGS. 1A to 1G are plan views and cross sectional views.

As shown in FIG. 1A, a first photoresist pattern PR1 is formed on an underlying layer UL1. The photoresist pattern PR1 has a plurality of stripes disposed in parallel and extending along one direction, e.g., along a horizontal direction in FIG. 1A. The underlying layer UL1 is etched by using the photoresist pattern PR1 as a mask.

Figure 1B:
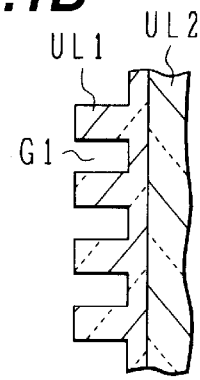

FIG. 1B is a schematic cross sectional view of the etched underlying layer UL1. The underlying layer UL1 is a layer stacked on another underlying layer UL2. The underlying layer UL1 is called a first underlying layer and the underlying layer UL2 is called a second underlying layer, where appropriate. A portion of the underlying layer UL1 covered with the photoresist pattern PR1 is not etched and is left with the original thickness. A portion of the underlying layer UL1 not covered with the photoresist and exposed is etched to form a groove portion G1.

After the underlying layer UL1 is etched partially by using the photoresist pattern PR1 shown in FIG. 1A, this pattern PR1 is removed and another photoresist pattern PR2 is formed.

Figure 1C:
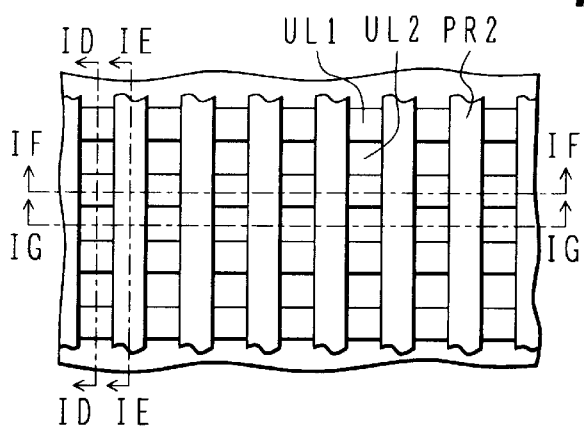

FIG. 1C is a schematic plan view showing the other photoresist pattern PR2. This pattern PR2 has a plurality of stripes extending along a direction crossing the stripes of the first photoresist pattern PR1, e.g., along the vertical direction in FIG. 1C. The underlying layer UL1 has already steps formed by the etching using the photoresist pattern PR1. The photoresist pattern PR2 traverses the steps. By using the photoresist pattern PR2, the first underlying layer UL1 is further etched to expose the second underlying layer UL2 in the space of each groove G1.

When the second underlying layer UL2 is exposed in the space of each groove, the first underlying layer UL1 is still left in the area where the layer UL1 was not etched while the first photoresist pattern PR1 was used.

When the second underlying layer UL2 is exposed in the openings of both the photoresist patterns PR1 and PR2, the first underlying layer UL1 in the areas covered with the first photoresist pattern PR1 or second photoresist pattern PR2 was etched to predetermined depths. The first underlying layer UL1 in the area covered with the first and second photoresist patterns PR1 and PR2 is left having the original thickness.

Figure 1D:
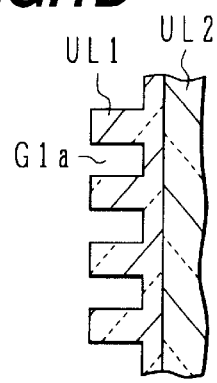
Figure 1E:
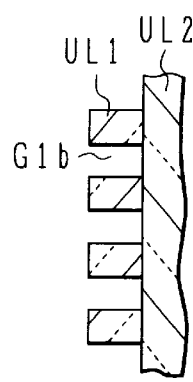
Figure 1F:
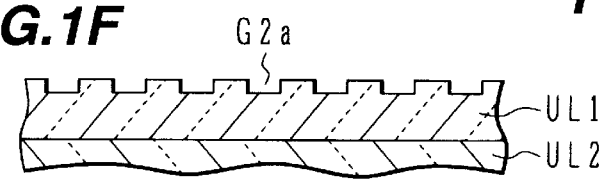

FIG. 1D is a cross sectional view taken along line ID—ID shown in FIG. 1C, and FIG. 1E is a cross sectional view taken along line IE—IE shown in FIG. 1C. Similarly, FIG. 1F is a cross sectional view taken along line IF—IF shown in FIG. 1C, and FIG. 1G is a cross sectional view taken along line IG—IG shown in FIG. 1C. In the structure shown in FIGS. 1A to 1G, the first etching depth is deeper than the second etching depth.

The vertical cross sectional views of FIGS. 1D and 1E show a groove G1$a$ with a thin first underlying layer UL1 (FIG. 1D) and a groove G1$b$ (FIG. 1E) with the underlying layer UL1 completely removed.

The area unetched by the first etching has a shallow groove G2$a$ as shown in FIG. 1F, and the area etched by the first etching has a shallow groove G2$b$ exposing the second underlying layer UL2 at its bottom as shown in FIG. 1G.

Figure 1H:
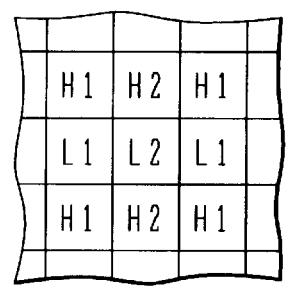
FIGS. 1H and 1I are diagrams, respectively illustrating the fundamental concept of the present invention.
Figure 1G:
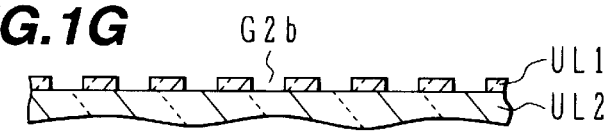

As shown in FIG. 1H, the substrate surface area is divided into four areas having four thicknesses: an area H1 where the first underlying layer UL1 was etched not at all; an area H2 where the first underlying layer UL1 was etched shallowly; an area L1 where the first underlying layer UL1 was deeply etched but not etched completely; and a area L2 where the first underlying layer UL1 was etched completely.

Figure 1I:
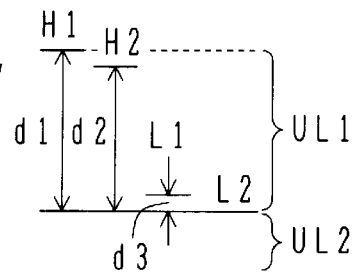

FIG. 1I is a graph showing a relation between the heights of the areas H1, H2, L1 and L2 having the thicknesses of the first underlying layer d1, d2, and d3. Here, The difference d1–d2 is approximately equal to d3. By using these areas with four different thicknesses, conductive wires and contact holes can be formed reliably.

A method of forming such areas will be described by taking DRAM manufacture processes as an example.

Figure 2A:
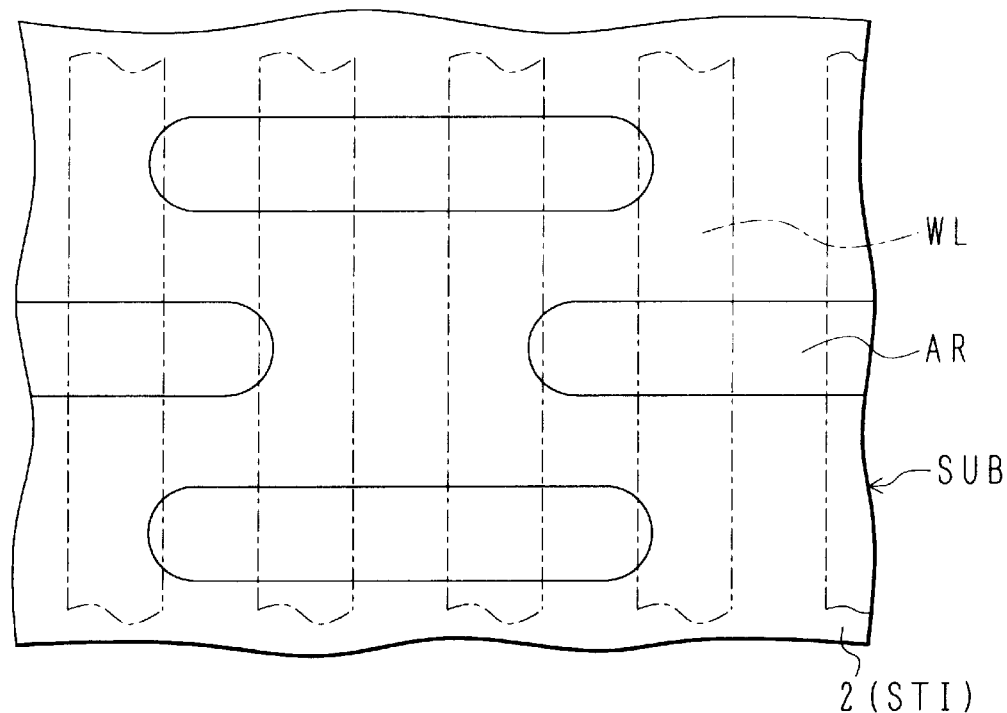
FIGS. 2A and 2B are plan views illustrating a semiconductor device manufacture method according to a first embodiment of the invention.

FIG. 2A is a plan view showing active regions AR defined by a shallow trench isolation (STI) region 2 formed on the surface of a semiconductor substrate SUB. Active regions AR have an elongated shape extended in a lateral (row) direction and disposed shifting their positions alternately at each row. An area extending in the row direction exists between active regions AR adjacent in the vertical (column) direction. This area is used for forming a bit line. A word line WL serving also as an insulated gate electrode is formed on the substrate, traversing the active region in the vertical direction. Two word lines WL are disposed on one active region AR and define source/drain regions in the central area and both end areas of each active region. After impurities are doped into the source/drain regions through ion implantation or the like, a first interlayer insulating film is formed covering the word lines WL.

If an SAC process is to be used, the interlayer insulating film is formed after the upper and side surfaces of the word line WL are covered with an etch stopper film. For example, if the interlayer insulting film is made of silicon oxide, a silicon nitride film is used as the etch stopper film.

Figure 2B:
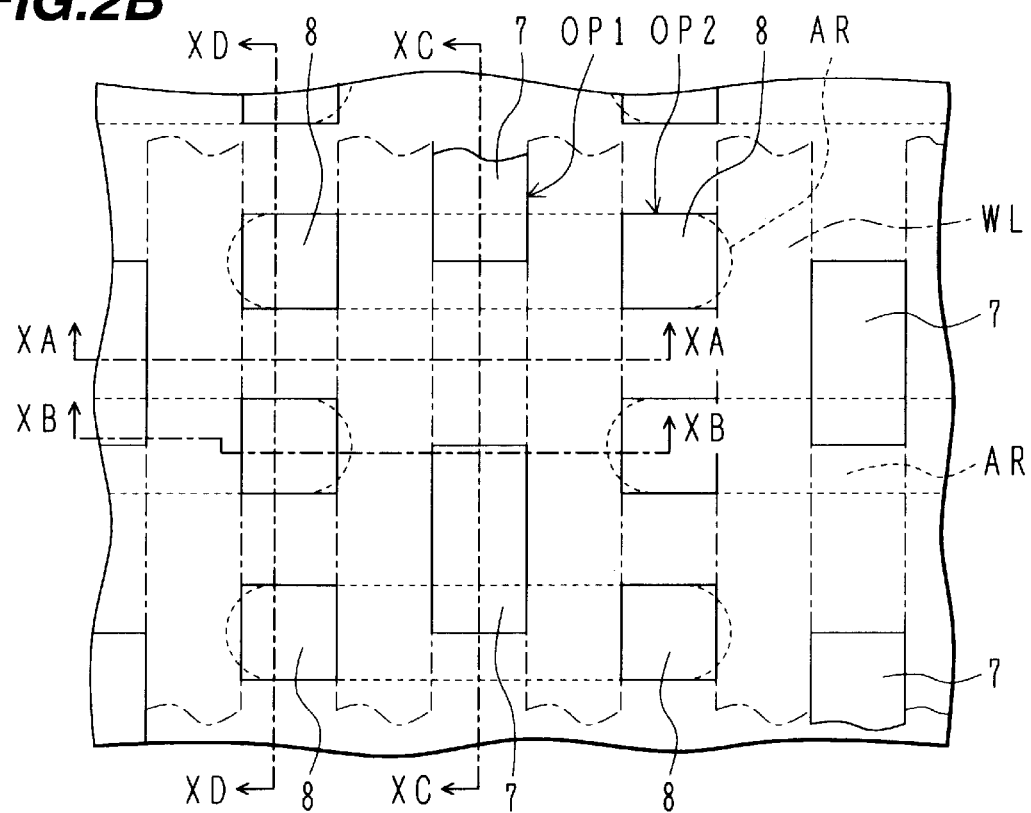

As shown in FIG. 2B, contact openings OP1 and OP2 are formed through the first interlayer insulating film. Conductive material such as polysilicon is deposited burying these contact openings, and the conductive material deposited on the upper surface of the first interlayer insulating film is removed to leave lower plugs 7 and 8 only in the contact openings.

If the surface of the word line WL is covered with the etch stopper film, the openings for the lower plugs 7 and 8 can be formed by an SAC process.

In the following drawings, FIGS. (a numerical number added with "A") are cross sectional views taken along line XA—XA extending in the horizontal direction in the area where the bit line is to be disposed. Figs. (a numerical number added with "B") are cross sectional views taken along line XB—XB extending in the row direction generally along the center line of the active regions AR. FIGS. (a numerical number added with "C") are cross sectional views taken along line XC—XC extending in the column direction generally along the center line of the lower plugs 7. Figs. (a numerical number added with "D") are cross sectional views taken along line XD—XD extending in the vertical direction generally along the center line of the lower plugs 8.

As shown in FIGS. 3A to 3D, a second interlayer insulating 9 of silicon oxide or the like is formed on the first interlayer insulating film 5 burying the lower plugs 7 and 8. A first photoresist pattern PR1 is formed on the second interlayer insulating film 9.

Figure 5A:
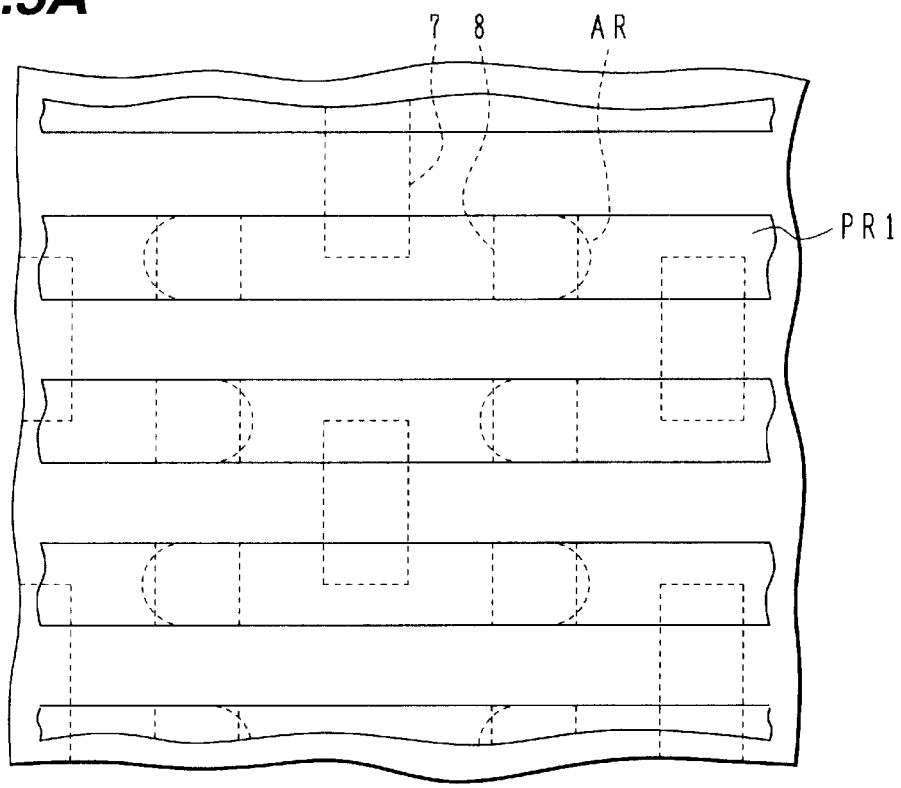
FIGS. 5A and 5B are plan views illustrating the semiconductor device manufacture method of the first embodiment.

FIG. 5A is a schematic plan view showing the shape of the first photoresist pattern PR1. The first photoresist pattern PR1 has a shape that a stripe pattern extending in the horizontal direction is disposed periodically in the vertical direction.

By using the photoresist pattern PR1, the second interlayer insulating film 9 is etched to an intermediate depth thereof. The thickness of the second interlayer insulating film left in a groove is selected in accordance with a thickness of an etch stopper film to be later formed.

FIGS. 3A, 3B, 3C and 3D are the cross sectional views taken along lines XA—XA, XB—XB, XC—XC, and XD—XD shown in FIG. 2B.

The surface layer of a p-type region of the substrate 1 has the STI region 2. The lower plug 7 (refer to FIG. 3C) extends on the area from the center source/drain region 3$a$ in the active region AR to the STI region 2. The lower plugs 8 are disposed on the source/drain regions in both end areas of the active region (refer to FIG. 3B).

Figure 3A:
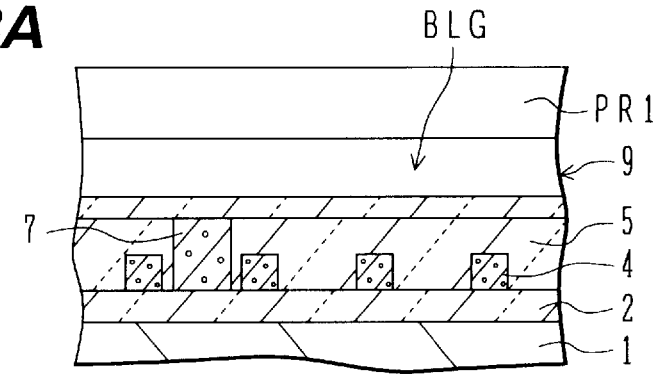
FIGS. 3A to 3D and FIGS. 4A to 4D are cross sectional views illustrating the semiconductor device manufacture method of the first embodiment.

By etching the second interlayer insulating film 9 on the surface of the first interlayer insulating film 5 by using the photoresist mask PR1 as a mask, a bit line groove BLG is formed as shown in FIG. 3A. As shown in FIGS. 3A and 3C, bit line grooves BLG are disposed at an equal pitch over the lower plugs 7 formed through the first interlayer insulating film 5.

Figure 3B:
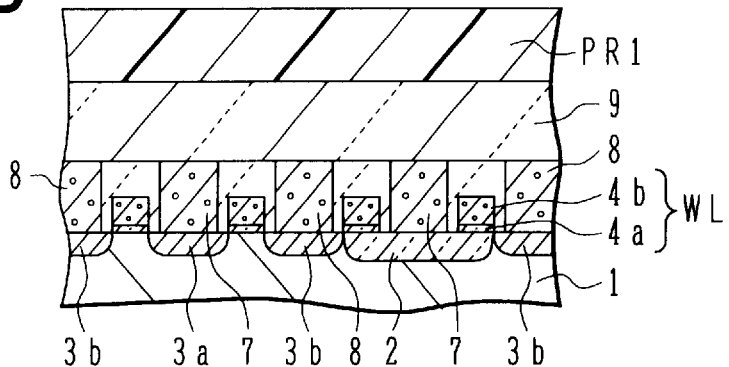
Figure 3C:
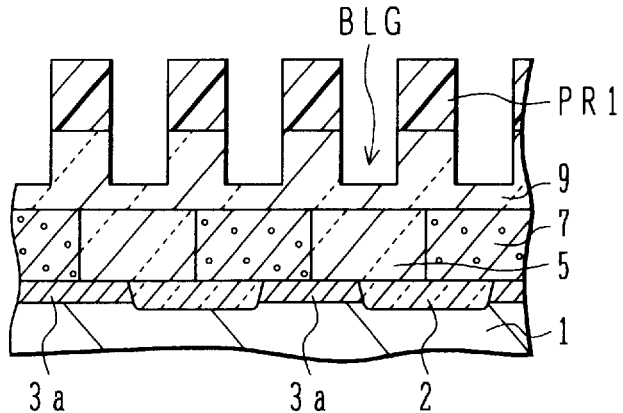
Figure 3D:
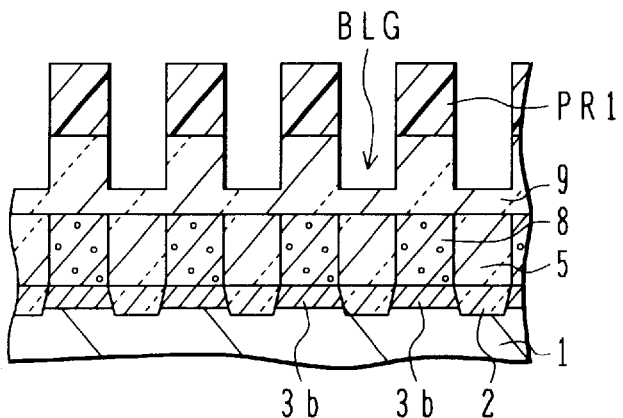

As shown in FIGS. 3B and 3D, the lower plug 8 is covered with the thick second interlayer insulating film 9. In this manner, the bit line groove BLG extending in the horizontal (row) direction shown in FIGS. 2A and 2B is formed. Thereafter, the first photoresist pattern PR1 is removed.

As shown in FIGS. 4A to 4D, a second photoresist pattern PR2 is formed on the second interlayer insulating film 9.

Figure 5B:
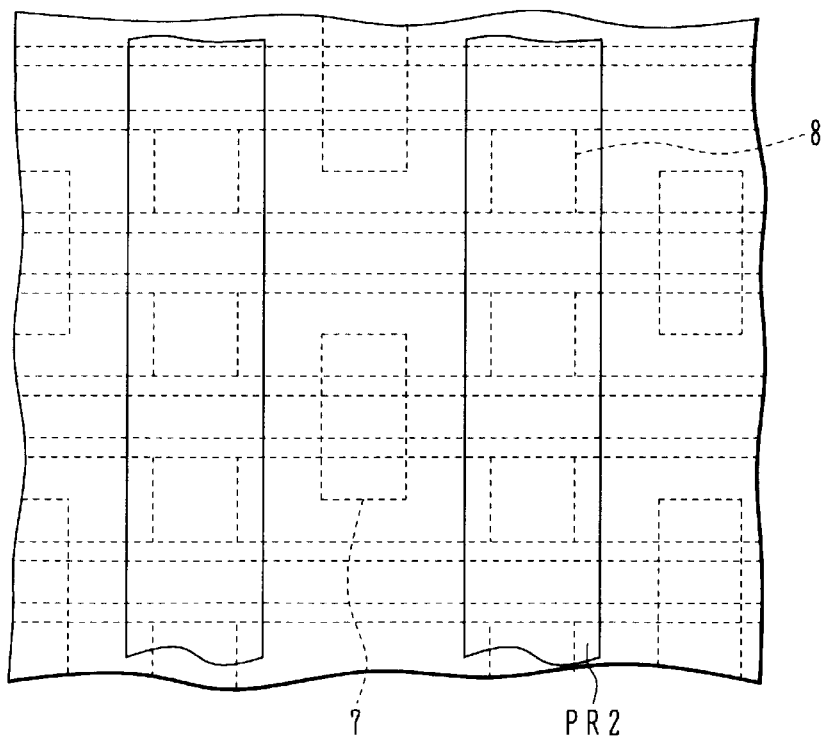

FIG. 5B is a schematic plan view showing the shape of the second photoresist pattern PR2. The second photoresist pattern PR2 has a shape that a stripe pattern wider than the width of the lower plug 8 is disposed periodically in the horizontal direction and defines the opening wider than the width of the lower plug 7.

Figure 4A:
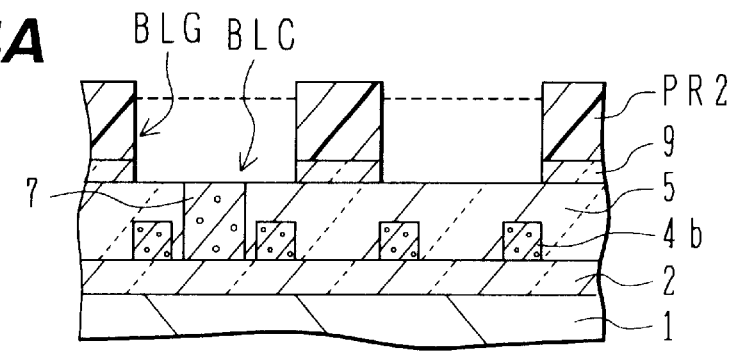
Figure 4B:
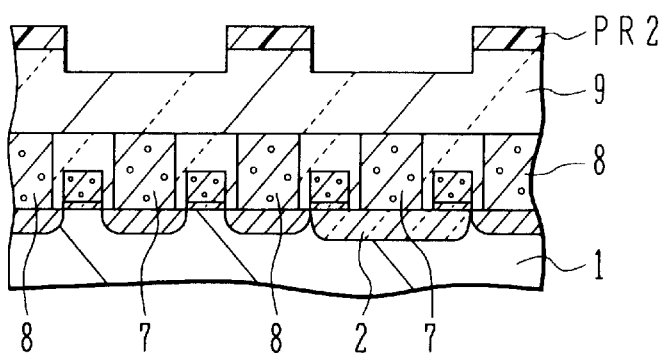

FIGS. 4A to 4D show the state that the second interlayer insulating film 9 was further etched by using the second photoresist pattern PR2. The second photoresist pattern PR2 is disposed covering stripes (word lines) extending in the vertical direction in FIGS. 2A and 2B. The second photoresist pattern PR2 is thick as shown in FIG. 4A in the area where the bit line groove was formed, and thin as shown in FIG. 4B in the area between bit line grooves BLG.

By using the second photoresist pattern PR2 as a mask, the second interlayer insulating film 9 is etched until the second interlayer insulating film 9 under the bit line groove BLG is removed. In this case, in the area not covered with the second photoresist pattern PR2, the second interlayer insulating film 9 is partially etched as shown in FIG. 4B. This etch depth has a generally equal thickness as that of the second interlayer insulating film 9 left under the bit line groove BLG.

If an over-etch is performed, the depth of a recess shown in FIG. 4B becomes deeper than the thickness of the left second interlayer insulating film 9. In this specification, this case is also called having the "generally equal thickness".

Figure 4C:
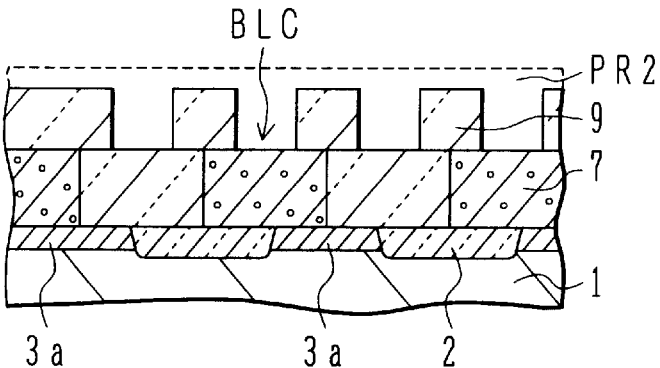
Figure 4D:
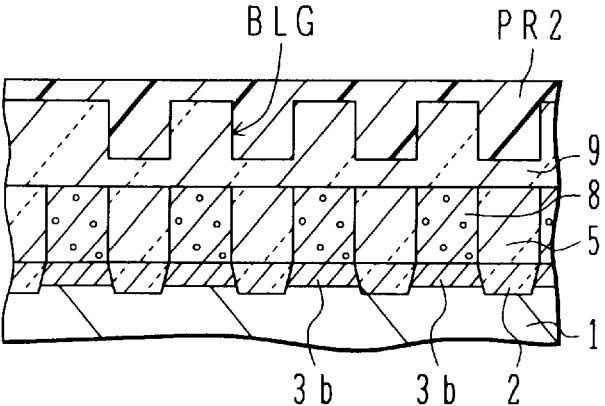

In the cross sectional views of FIGS. 4C and 4D taken along vertical lines XC—XC and XD—XD, in the area not covered with the second photoresist pattern PR2, a bit line contact hole BLC is formed in an area corresponding to the central area of the lower plug 7. In the area covered with the second photoresist pattern PR2, the second interlayer insulating film 9 formed the bit line groove BLG maintains the original shape.

The width of the bit line contact hole BLC is wider than that of the lower plug 7 in the direction of the bit line groove BLG, as shown in FIG. 4A.

The second photoresist pattern PR2 is thereafter removed.

As shown in FIGS. 6A to 6D, an etch stopper film of silicon nitride or the like is deposited over the whole substrate surface. The etch stopper film on the flat surface is etched back to leave an etch stopper film 10 only on the side walls of each step. Thereafter, a thin Ti layer (5 nm in thickness), a thin TiN layer (10 nm in thickness) and a thick W layer are deposited over the whole substrate surface. These layers are first removed down to the upper surface of the second interlayer insulating film by etch-back, chemical mechanical polishing (CMP) or the like. Then, the W layer in a shallow groove is etched back and removed.

A bit line 11 of W is therefore formed in the bit line contact hole BLC and bit line groove BLG. The upper surface of the bit line 11 is lower than the upper surface of the second interlayer insulating film, and the Ti, TiN and W layers in the shallow groove on the surface of the second interlayer insulating film 9 are removed. Although the bit line is generally made of a multi-layer conductive film as in this example, it may be made of a single film.

Figure 6A:
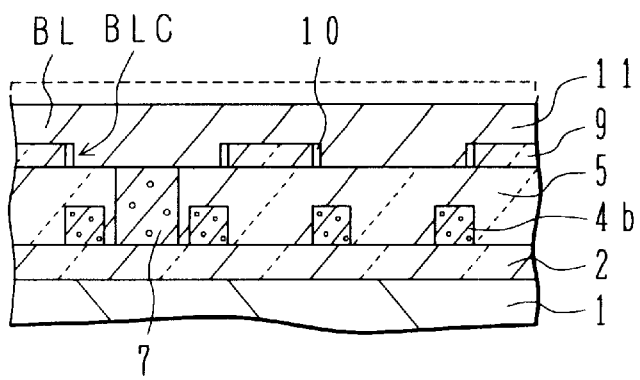
FIGS. 6A to 6D, FIGS. 7A to 7D, FIGS. 8A to 8D and FIGS. 9A to 9D are cross sectional views illustrating the semiconductor device manufacture method of the first embodiment.
Figure 6B:
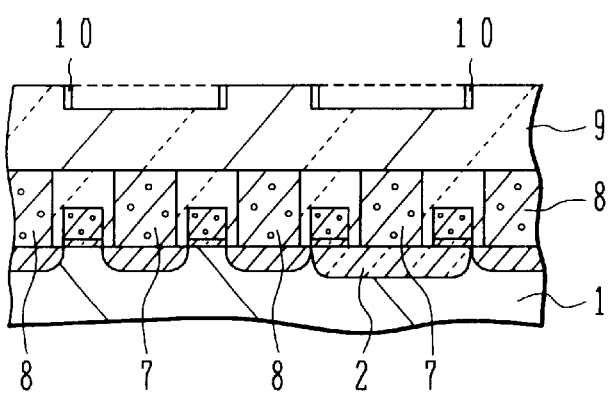
Figure 6C:
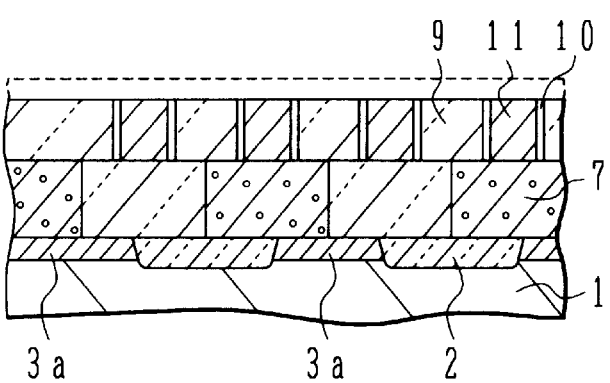
Figure 6D:
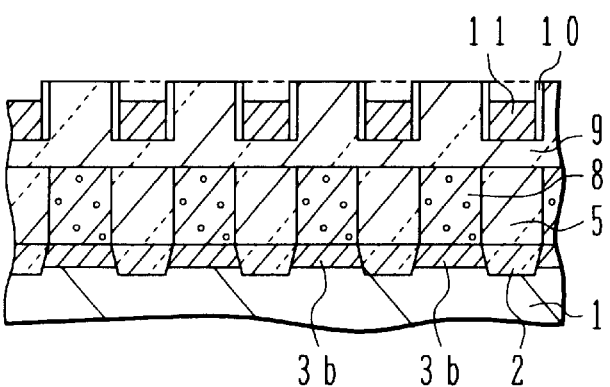

As shown in FIG. 6D, the bit line 11 has a shallow upper space.

As shown in FIGS. 7A to 7D, an etch stopper film 12 of silicon oxide or the like is deposited burying the shallow groove on the upper surface of the second interlayer insulating film 9. The etch stopper film 12 on the uppermost surface of the second interlayer insulating film 9 is removed by CMP or the like. The thickness of the etch stopper film 12 may reduce somewhat by CMP, but can be said to be approximately equal to the original steps formed in the upper and lower positions of the second interlayer insulating film 9.

Figure 7A:
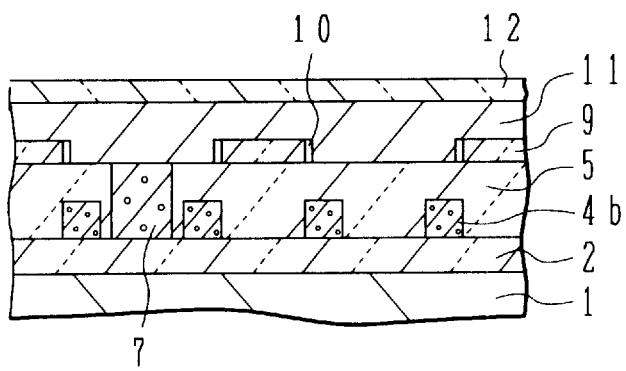
Figure 7B:
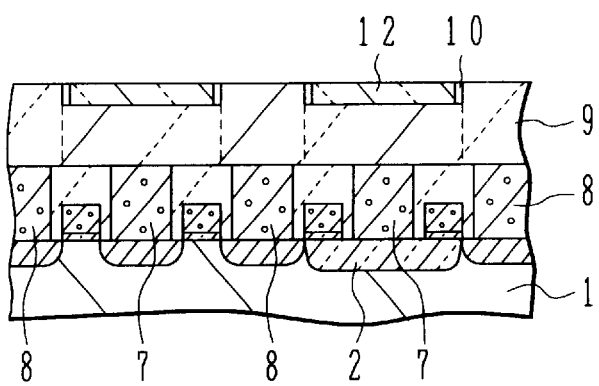
Figure 7C:
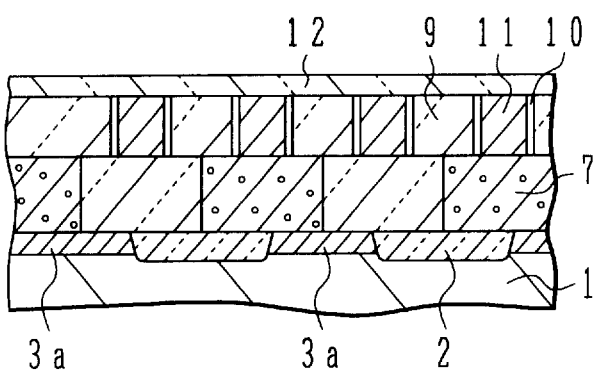
Figure 7D:
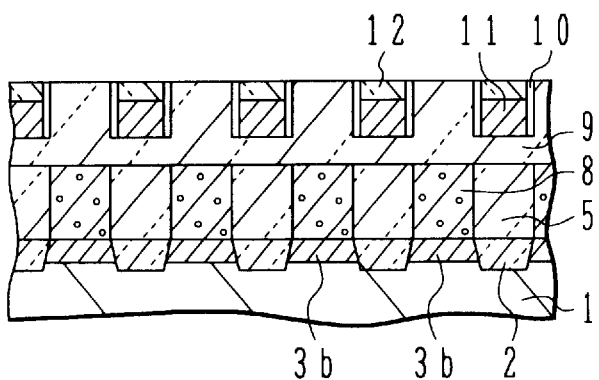
Figure 8A:
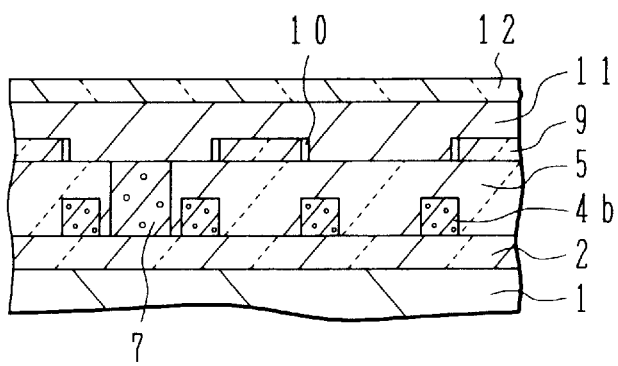
Figure 8B:
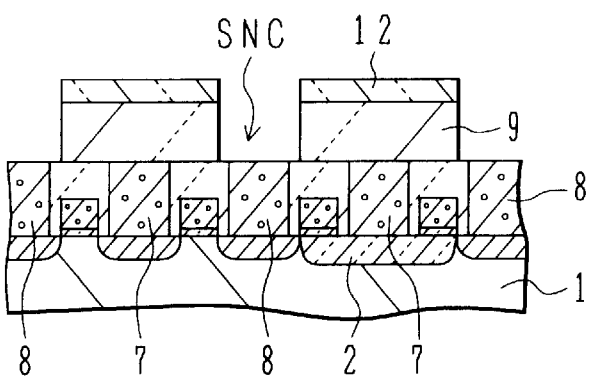
Figure 8C:
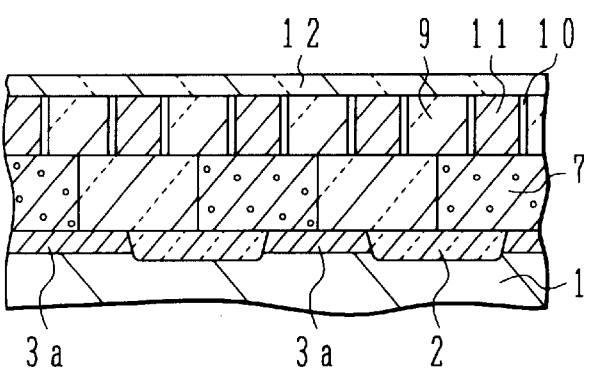
Figure 8D:
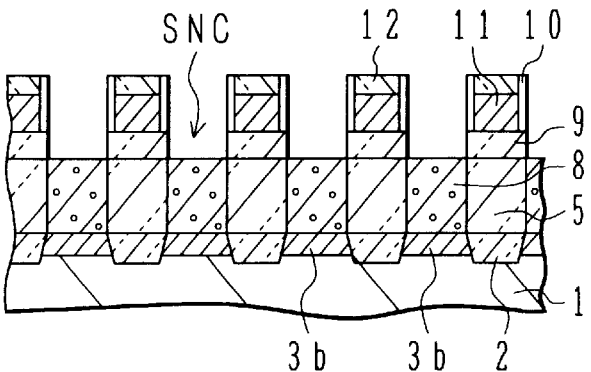
Figure 9A:
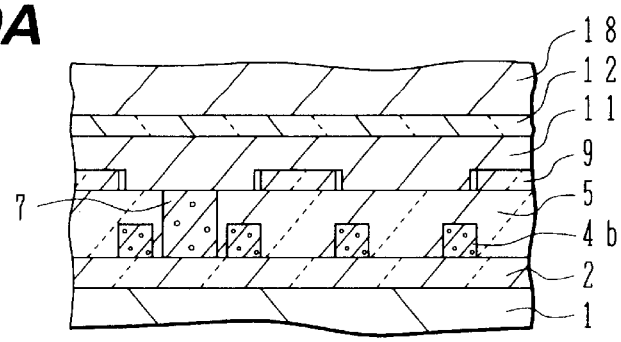
Figure 9B:
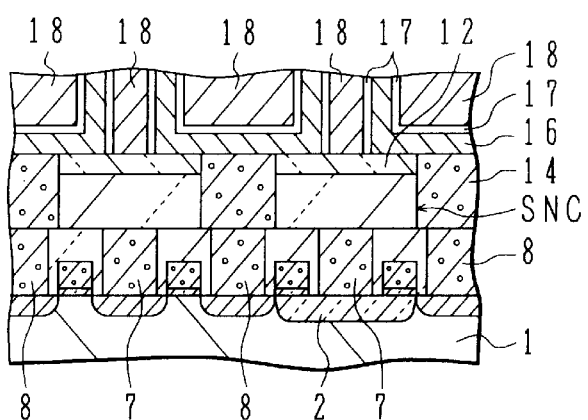
Figure 9C:
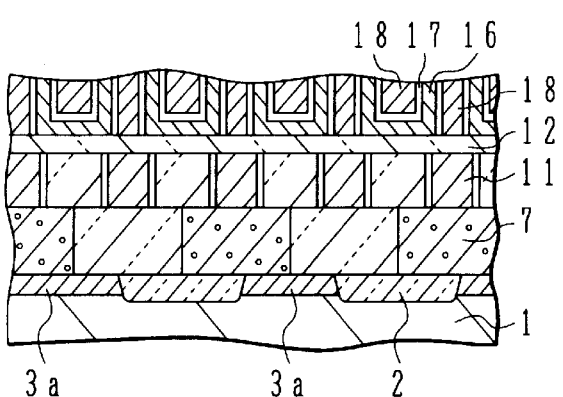
Figure 9D:
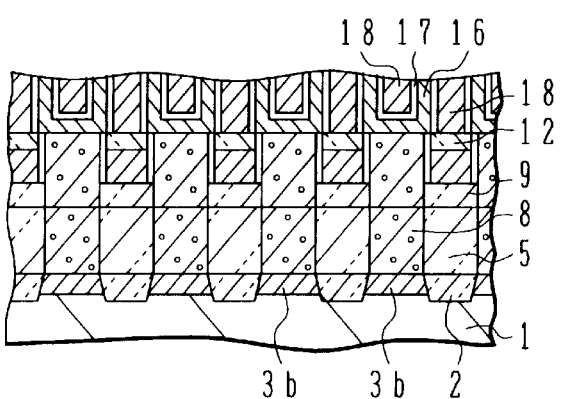
Figure 10A:
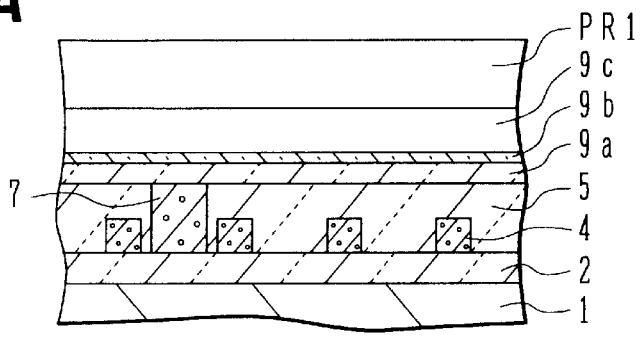
FIGS. 10A to 10D, FIGS. 11A to 11D and FIGS. 12A to 12D are cross sectional views illustrating a semiconductor device manufacture method according to a second embodiment of the invention.
Figure 10B:
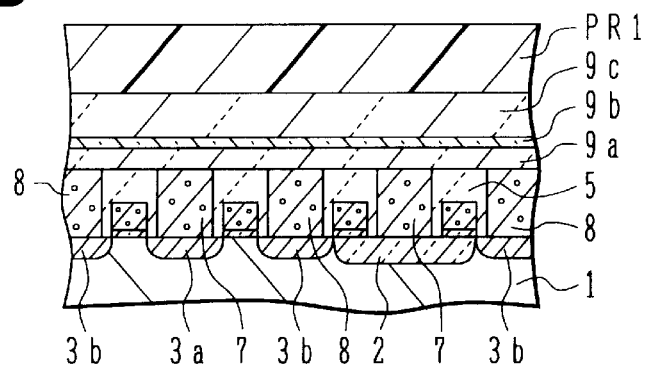
Figure 10C:
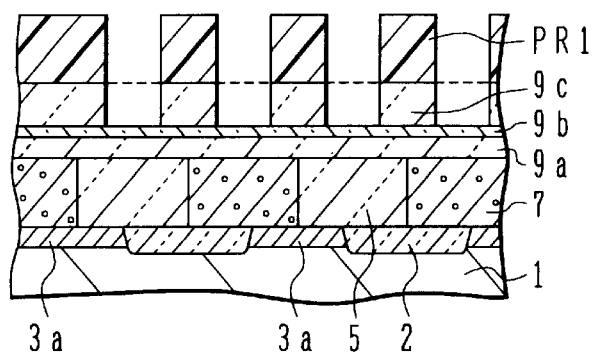
Figure 10D:
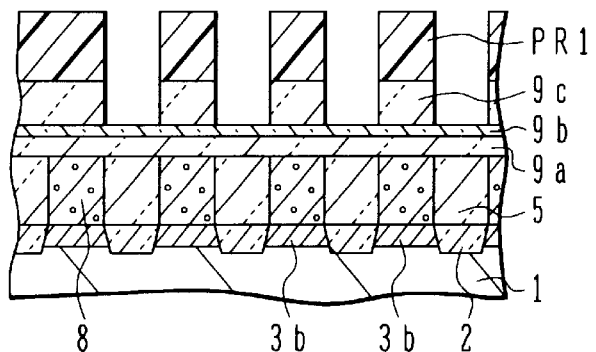
Figure 11A:
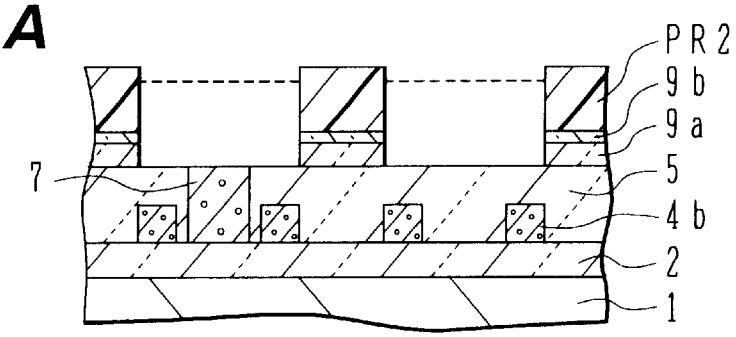
Figure 11B:
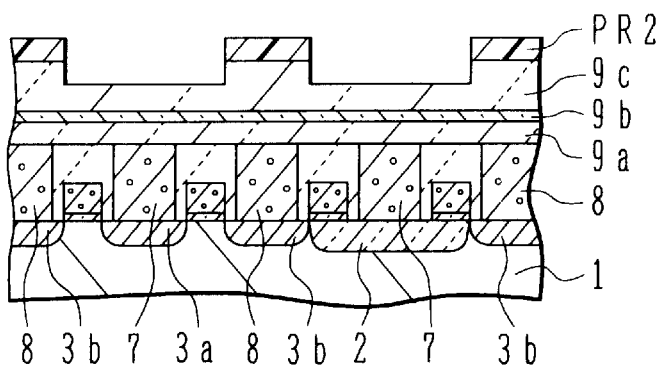
Figure 11C:
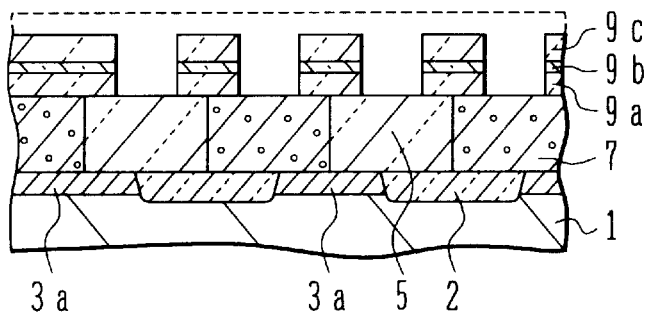
Figure 11D:
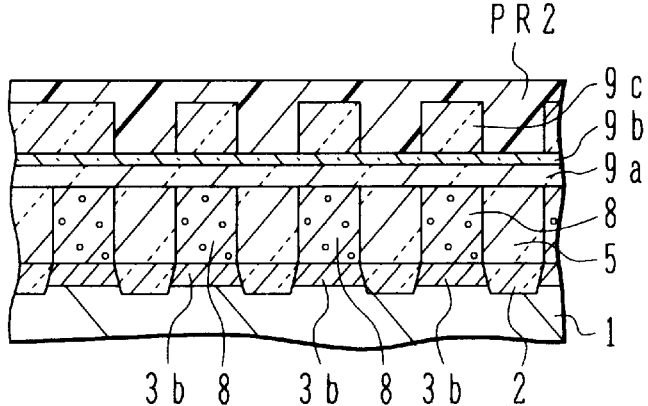
Figure 12A:
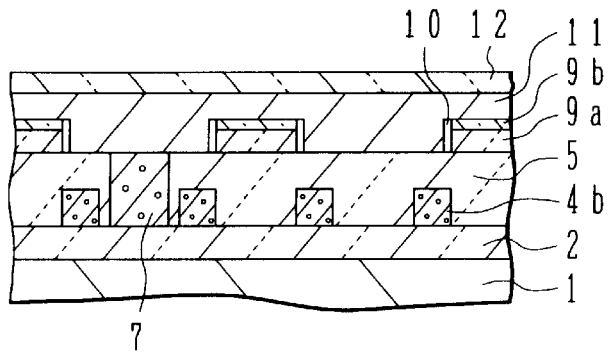
Figure 12B:
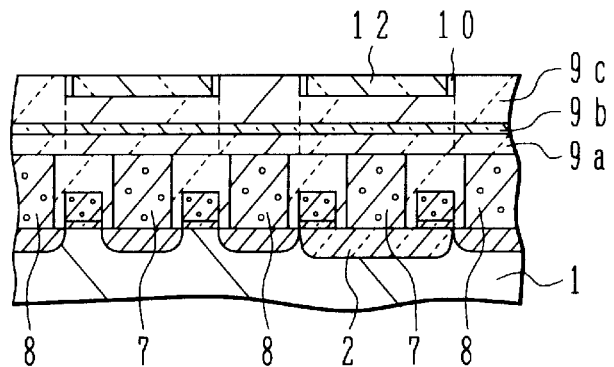
Figure 12C:
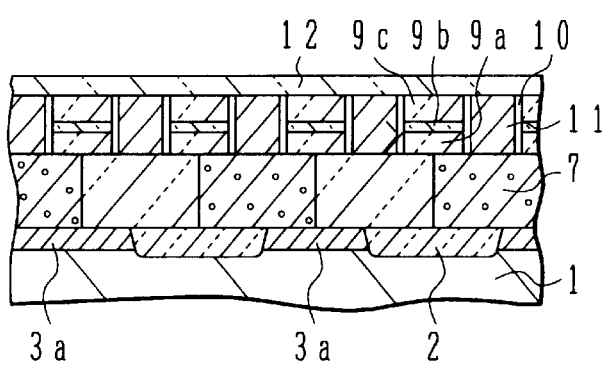
Figure 12D:
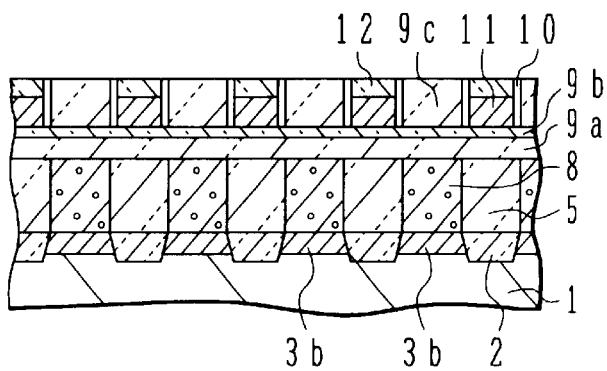

As shown in FIGS. 7A, 7C and 7D, the upper surface of the bit line 11 is therefore covered with the etch stopper film 12.

As shown in FIGS. 7B and 7D, in the area between bit lines 11, the uppermost surface of the second interlayer insulating film 9 is exposed in the area corresponding to the lower plug 8. This area exposing the second interlayer insulating film 9 is surrounded by the etch stopper films 10 and 12.

As shown in FIGS. 8A to 8D, by using the etch stopper film 12 as a mask, the exposed second interlayer insulating film 9 is anisotropically etched. This anisotropic etching forms a storage node opening SNC exposing the lower plug 8. The storage node opening SNC can be formed by using the mask for defining the bit line contact area and an additional mask is not necessary.

As shown in FIGS. 9A to 9D, a storage electrode plug 14 is formed in the storage node opening SNC. For example, the storage electrode plug 14 is formed by forming a polysilicon layer over the whole substrate surface and removing the polysilicon layer at the level higher than the surface of the etch stopper film 12 by CMP or the like.

Thereafter, a storage capacitor is formed on the storage electrode plug 14 by a known method. For example, the storage capacitor is formed in the following manner. A sacrificial film of silicon oxide or the like is first formed, and an opening for the storage electrode is formed. A storage electrode 16 is formed on the inner surface of the storage electrode opening, for example, by depositing an Ru film. After the storage electrode film on the sacrificial film is removed, the sacrificial film is removed. A capacitor dielectric film 17 is formed on the whole substrate surface, and a plate electrode 18 is formed thereon.

In this manner, the storage capacitor can be formed on each storage electrode plug 14. If the sacrificial film is removed after the opening is buried with the storage electrode film, a pillar type storage electrode can be formed in place of the cylinder type storage electrode shown in FIGS. 9B.

The storage electrode plug may be formed at the same time when the storage electrode is formed, by omitting the etching process shown in FIGS. 8A to 8D and performing an etching process similar to that shown in FIGS. 8A to 8D to form the storage electrode opening and storage node opening at the same time.

The photoresist patterns used by the embodiment have a simple shape such as shown in FIGS. 5A and 5B. A contact opening is formed in an area where a deep groove and a shallow groove formed along two crossing directions are overlapped. After the bit line is buried, the upper surface of the bit line is etched to a depth corresponding to the depth of the shallow groove. An etch stopper is buried in a recessed space of the bit line lower than the unetched upper surface.

In this manner, the surface of the second interlayer insulating film in the area covered with the first and second photoresist masks PR1 and PR2 is automatically exposed. The exposed second interlayer insulating film is etched to expose the upper surface (contact surface) of the lower plug of the storage capacitor.

In this embodiment, the etch depth shown in FIGS. 3C and 3D is controlled by an etching time or the like in order to stop the etching before the second interlayer insulating film is completely etched.

As seen from the plan view of FIG. 5B, the width of the bit line contact hole is related to the width of the storage capacitor contact hole to be later formed, and if the one width is made wider, the other width is made narrower. If the bit line contact hole is made narrow, the storage node contact hole becomes wide so that a parasitic capacitance between the bit line and storage capacitor increases.

FIGS. 10A to 10D, FIGS. 11A to 11D and FIGS. 12A to 12D illustrate another method of manufacturing a DRAM device.

FIGS. 10A to 10D illustrate the manufacture step corresponding to that shown in FIGS. 3A to 3D of the first embodiment.

In the second embodiment, instead of using a single layer as the second interlayer insulating film 9, it is made of a plurality of layers having different etching characteristics. As shown in FIGS. 10A to 10D, the second interlayer insulating film has a lamination structure of a silicon oxide film 9a, a silicon nitride film 9b and a silicon oxide film 9c. The uppermost silicon oxide film 9c serves as the main film of the second interlayer insulating film. The intermediate silicon nitride film 9b is used for providing an etch stopper function and its thickness is selected thin. The lowermost silicon oxide film 9a functions as an insulating film between a bit line 11 and a lower plug 8 and has a thickness sufficient for relaxing an irregularity of the upper surface of the second interlayer insulating film.

The etching process in FIGS. 10A to 10D is performed by using the silicon nitride film 9b as an etch stopper film. Therefore, the etching process automatically stops at the upper surface of the silicon nitride film 9b so that the control of an etch depth becomes easy.

As shown in FIGS. 11A to 11D, a second photoresist pattern PR2 is formed over the whole substrate surface. By using this second photoresist pattern PR2 as a mask, the exposed silicon nitride film 9b and its underlying silicon oxide film 9a are etched. In this case, a shallow groove is formed on the upper surface of the second interlayer insulating film not covered with the second photoresist pattern PR2. This process corresponds to that shown in FIGS. 4A to 4D.

As shown in FIGS. 12A to 12D, an etch stopper film is formed on the whole substrate surface. The etch stopper film on the flat surface is etched back to leave an etch stopper film 10 only on the side walls of each step formed by a bit line groove BLG. A bit line 11 is then formed, and the upper surface of the bit line 11 etched until the bottom of the shallow groove on the surface of the second interlayer insulating film is exposed. Thereafter, an etch stopper film 12 of silicon nitride or the like is deposited, and the uppermost surface of the second interlayer insulating film 9c is exposed by CMP or the like. These processes correspond to those shown in FIGS. 6A to 7D. Thereafter, processes similar to the first embodiment are performed to form a storage capacitor.

In this embodiment, since the second interlayer insulating film has the lamination structure including the etch stopper film, the etching for the bit line groove automatically stops and the control of etching is easy. The relation between the width of the bit line contact hole and the width of the storage electrode contact hole still remains as in the first embodiment.

FIGS. 13A to 13D, FIGS. 14A to 14D, FIGS. 15A to 15D, FIGS. 16A to 16D, FIGS. 17A to 17D, FIGS. 18A to 18D and FIGS. 19A to 19D are cross sectional views illustrating a third embodiment in which the width of a bit contact hole and a width of a storage capacitor contact hole can be controlled independently.

Figure 13A:
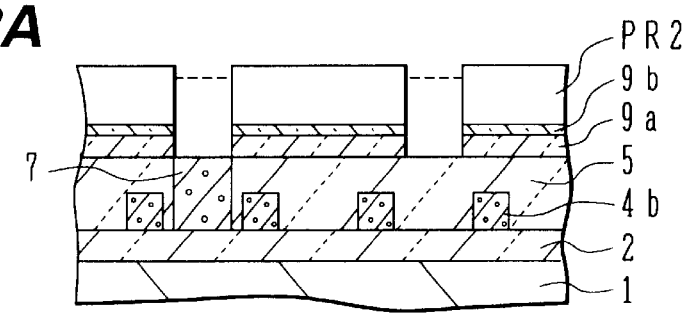
Figure 13B:
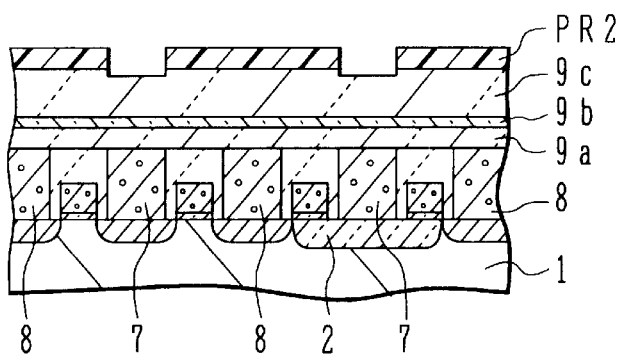
Figure 13C:
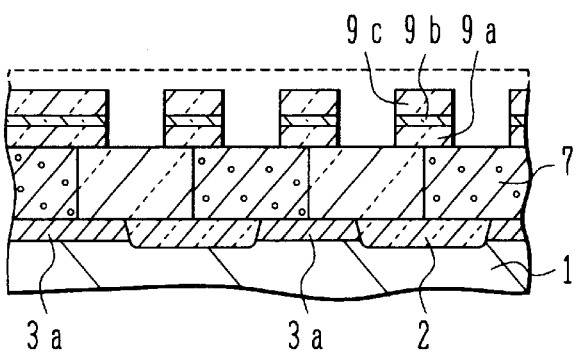
Figure 13D:
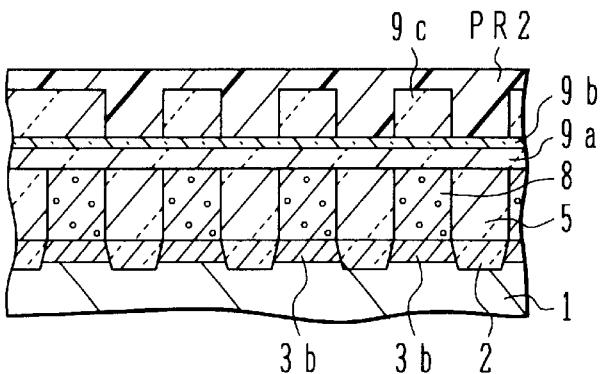
Figure 14A:
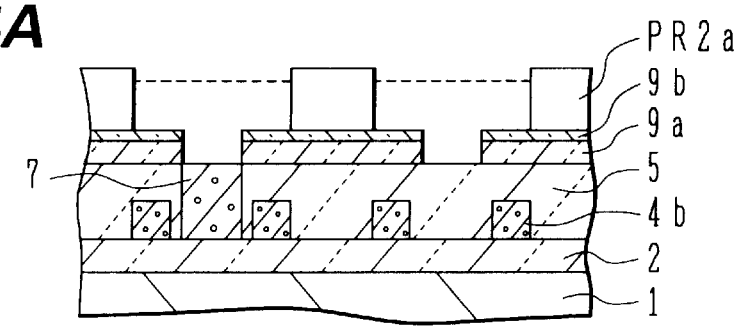
Figure 14B:
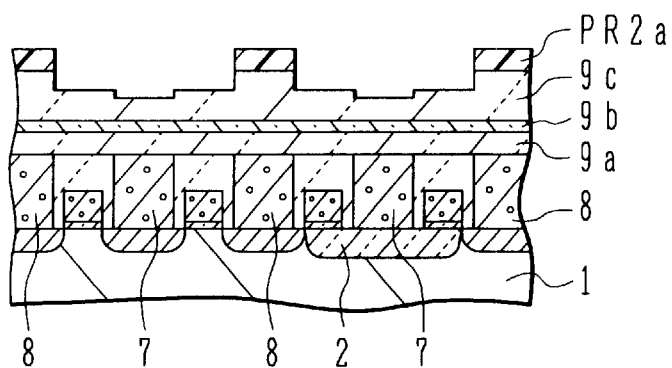
Figure 14C:
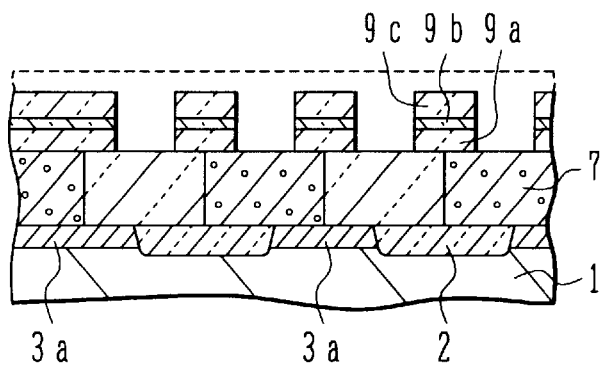
Figure 14D:
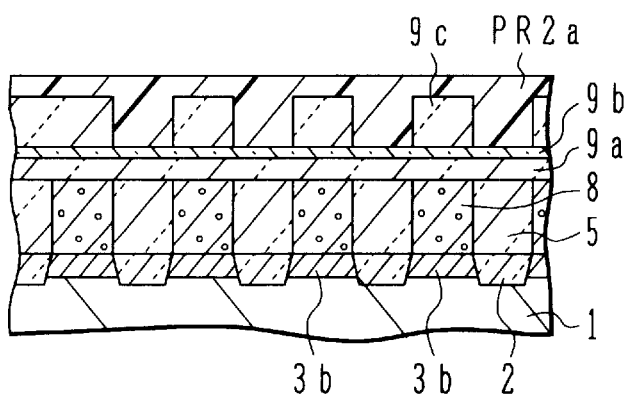
Figure 15A:
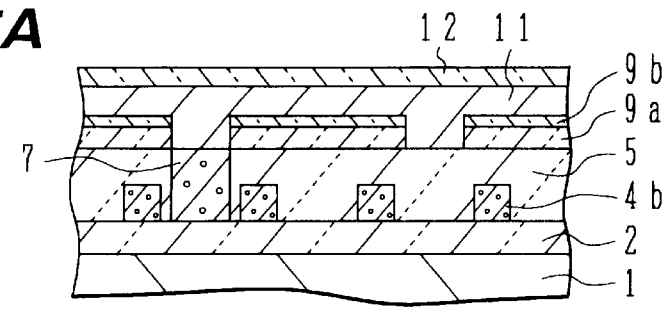
Figure 15B:
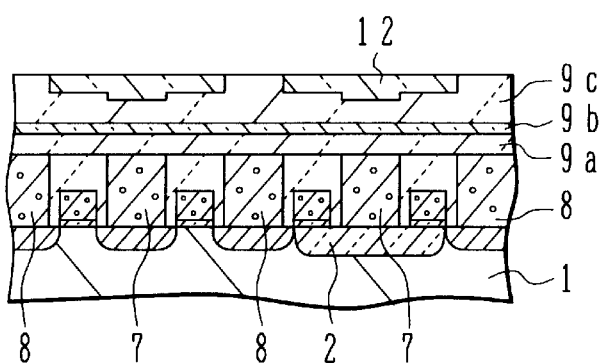
Figure 15C:
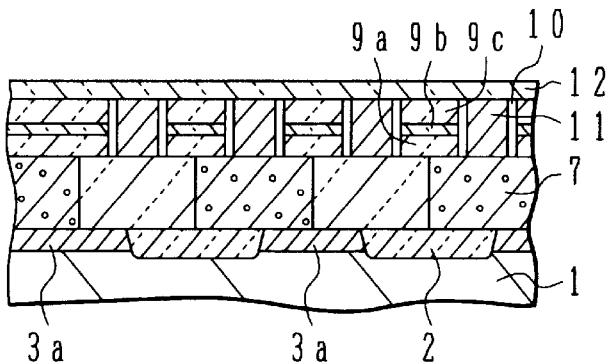
Figure 15D:
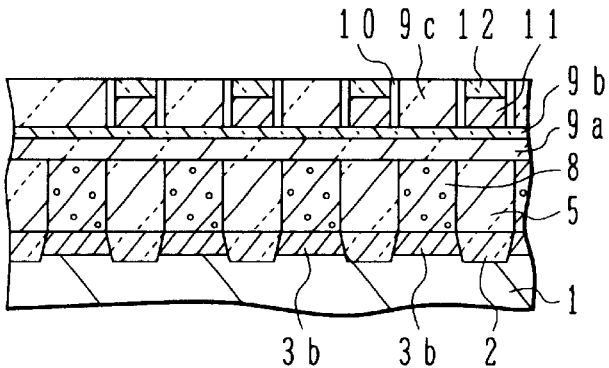
Figure 16B:
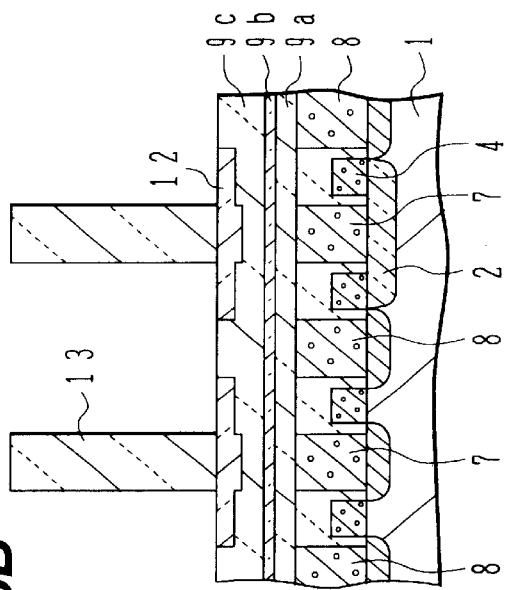
Figure 16D:
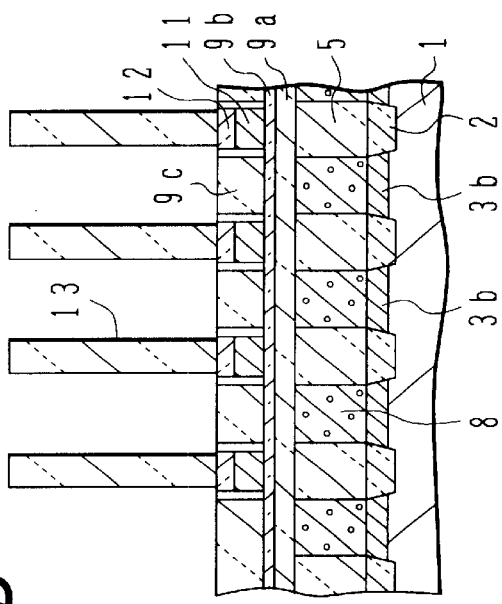
Figure 16A:
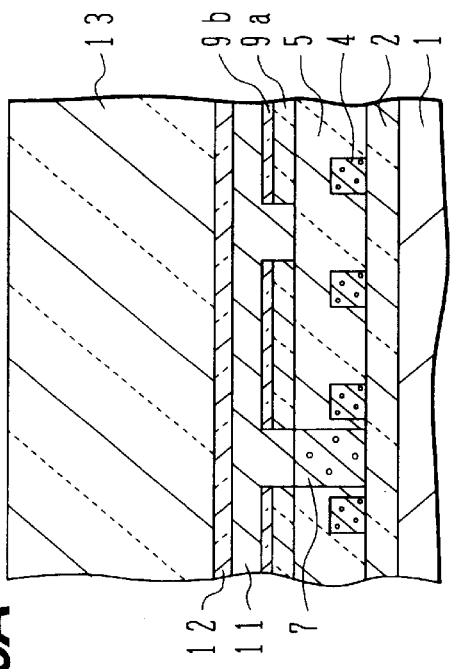
Figure 16C:
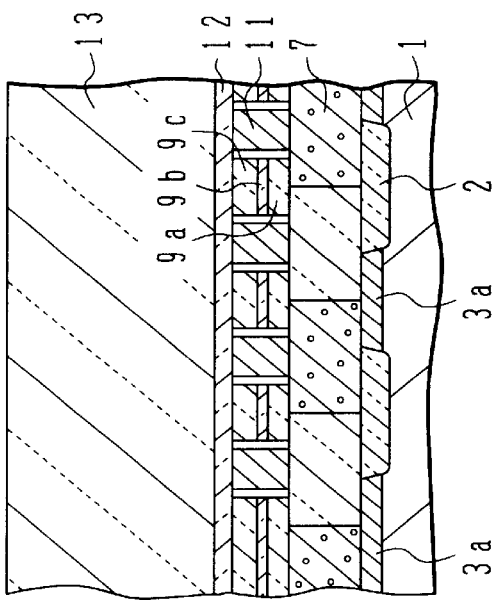
Figure 18A:
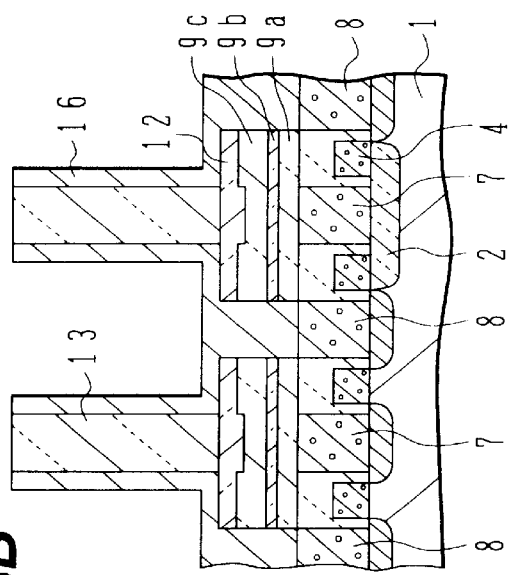
Figure 18B:
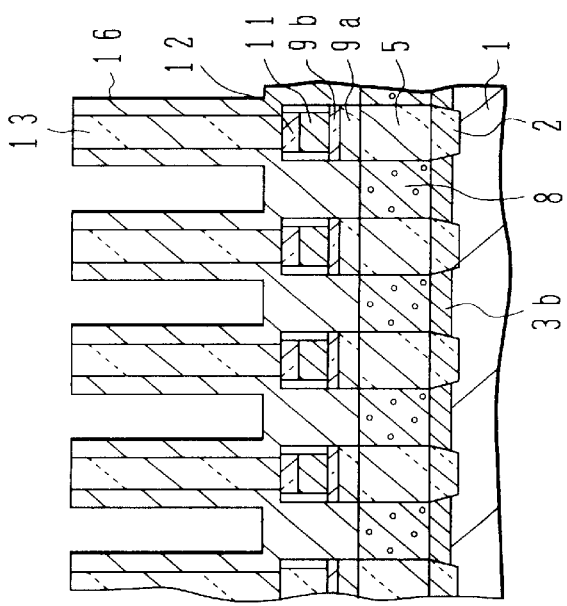
Figure 18C:
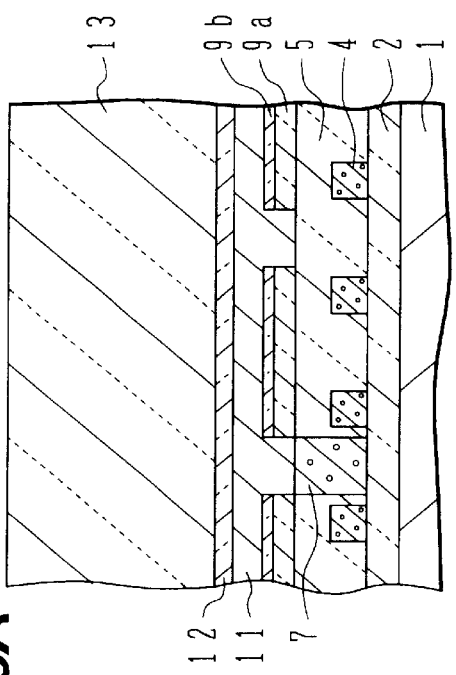
Figure 18D:
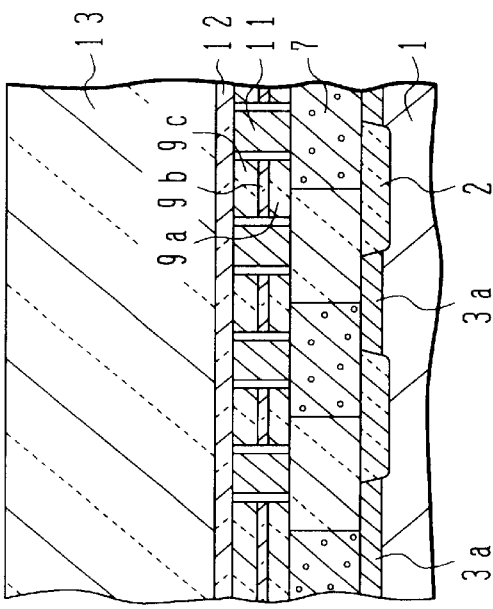
Figure 19A:
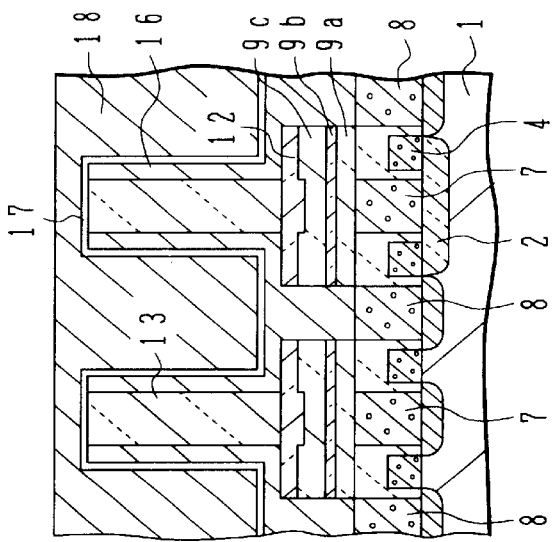
Figure 19B:
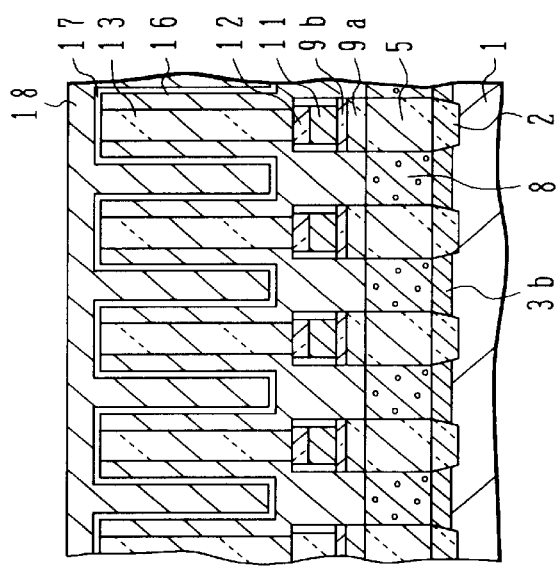
Figure 19C:
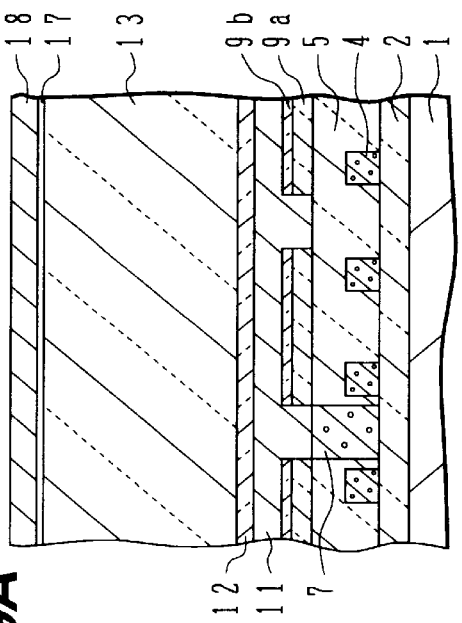
Figure 19D:
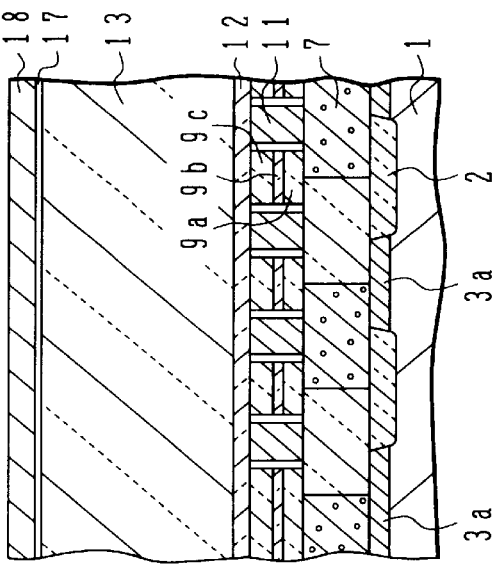

As shown in FIGS. 13A to 13D, after the bit line groove is formed by using the second interlayer insulating film having the lamination structure similar to the second embodiment, the first photoresist pattern PR1 is removed and the second photoresist pattern PR2 is formed. The second photoresist pattern PR2 has a stripe opening having the width equal to the width of an area where a bit line contact hole is formed. By using the second photoresist pattern PR2 as a mask, the silicon nitride film 9b and silicon oxide film 9a are etched to expose the surface of the bit line contact lower plug 7. In this case, as shown in FIGS. 13B and 13C, the area not covered with the second photoresist pattern PR2 other than the area where a bit line groove is formed, is etched by a depth corresponding to the total thickness of the silicon nitride film 9b and silicon oxide film 9a, similar to the second embodiment.

As shown in FIGS. 14A to 14D, after the surface of the bit line contact lower plug 8 is exposed, the second photoresist pattern PR2 is etched and retracted in the lateral direction by ashing or the like to form a second photoresist pattern PR2a. The width of this photoresist pattern PR2a corresponds to the width of the storage capacitor contact hole.

As shown in FIGS. 1 5A to 15D, similar to the second embodiment, the bit line 11 is formed and the upper surface is etched lower than the uppermost surface of the second interlayer insulating film. An etch stopper film 12 of silicon nitride is buried in the space above the bit line 11.

As shown in FIGS. 16A to 16D, a thick insulating layer 13 of silicon oxide or the like is formed on the upper surfaces of the etch stopper film 12 and exposed silicon oxide layer 9c. A resist pattern having a storage electrode opening is formed on the interlayer insulating layer 13 to anisotropically etch the insulating layer 13. An opening having a shape conformal to the storage electrode is therefore formed through the insulating layer 13. FIGS. 16A to 16D show the state that the surface of the etch stopper layer 12 is exposed.

As shown in FIGS. 17A to 17D, as the etching continues further, this etching is suppressed in the area where the etch stopper layer 12 is exposed whereas it continues in the area where the silicon oxide film 9c is exposed.

Although the etching stops once in the state that the thin silicon nitride film 9b is exposed, if the etching is performed under the condition that silicon nitride can be etched, the silicon nitride film 9b can be etched. In this case, although the relatively thick etch stopper layer 12 is slightly etched, most of this layer 12 are left unetched. In succession, the silicon oxide film 9a is etched to expose the upper surface of the storage electrode lower plug 8.

As shown in FIGS. 18A to 18D, a storage electrode film is formed over the whole substrate surface. For example, the storage electrode film is a lamination including an Ru layer (or TiN, WN, W, SRO layer or the like). In this case, the opening above the storage electrode lower plug 8 is buried with the storage electrode film. The storage electrode film deposited on the upper surface of the insulating layer 13 is removed by CMP or the like to leave a storage electrode 16. The material of the storage electrode 16 is selected to match the material of the capacitor dielectric film to be later formed.

As shown in FIGS. 19A to 19D, after a capacitor dielectric film 17 is formed over the whole substrate surface, covering the storage electrode 16, a plate electrode 18 is formed on the capacitor dielectric film 17. In this manner, a memory structure of the DRAM device can be formed. After CMP, the insulating layer 13 may be removed completely and thereafter the capacitor dielectric film 17 and plate electrode 18 are deposited to form a cylinder type capacitor structure. Alternatively, the storage electrode 16 may be formed burying the storage electrode opening, and after CMP, a pillar type capacitor structure is formed by processes similar to those for the cylinder type capacitor structure.

In the third embodiment, after the bit line contact hole is formed, the resist pattern is retracted in the lateral direction to adjust the size of the storage electrode opening. Similar effects may be realized by other methods. An exposed area of a resist layer changes if the layer has a thickness distribution. This can be utilized effectively to adjust the sizes of the bit line opening and storage electrode opening.

Figure 20:
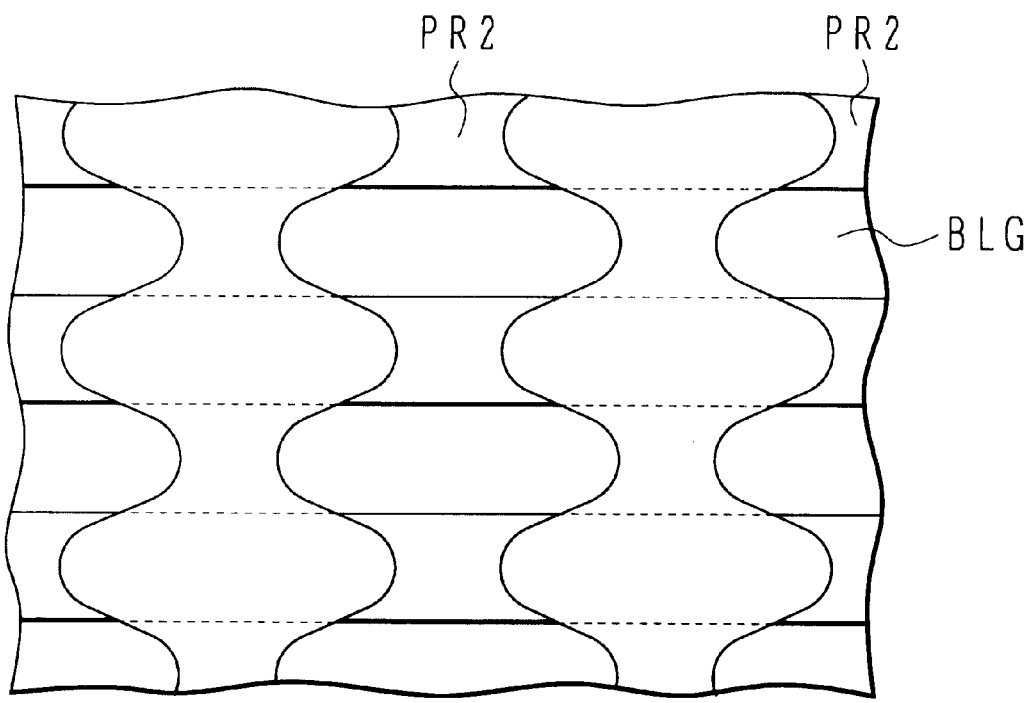
FIG. 20 is a plan view showing a photoresist pattern according to another embodiment of the invention.

FIG. 20 is a plan view of a second photoresist pattern PR2 illustrating a change in the exposure pattern caused by a thickness distribution in the resist layer. The resist pattern formed on a bit line groove BLG etched deeply is thick, whereas the resist pattern formed between bit lines is thin because of the thick interlayer insulating film.

As a second photoresist pattern PR2 made of positive type resist is exposed, the width of an area exposed and developed becomes narrow in the area of the deep bit line groove BLG, whereas the width of an area exposed becomes broad in the area where the insulating film is thick and the resist layer thereon is thin. It is therefore possible to form both the bit line opening and storage electrode contact hole narrow. A combination of a change in the exposure area width with the resist layer thickness (third embodiment) and the retraction of the resist layer width (second embodiment), may be used.

A parasitic capacitance between a bit line and a storage electrode can be reduced by reducing the areas of the bit line and storage electrode facing each other. FIGS. 21A to 21D are plan views showing the positional relation between a bit line and a storage electrode. In this embodiment, the plan shape of the storage electrode is slanted relative to the bit line to reduce the parasitic capacitance therebetween. In this embodiment, it is assumed that the storage electrode is formed at the same time when the storage electrode contact is formed, by using a mask having a storage electrode pattern as shown in FIG. 24.

Figure 21A:
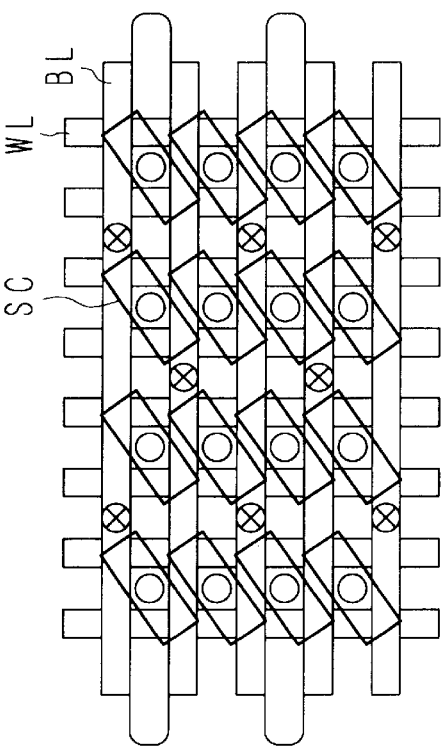
FIGS. 21A to 21D are plan views showing examples of the shape of a storage electrode of a semiconductor memory device according to another embodiment of the invention.

In the example shown in FIG. 21A, a plurality of word lines WL extend on the substrate in the vertical direction, and a plurality of bit lines BL extend over the word lines in the horizontal direction. The upper and side surfaces of both the word line WL and bit line BL are assumed to be covered with an etch stopper film. As shown in FIG. 21A, the storage capacitor SC has a rectangular plan shape and is disposed along a left downward direction relative to the bit line BL and word line WL. If the longer side of the storage capacitor SC is disposed in parallel to the bit line BL, the whole length of the longer side contributes to forming a parasitic capacitance. In this example, since the longer side is disposed obliquely, the area of the storage capacitor SC facing the bit line BL is small. If a thick insulating film is interposed between the bit line BL and the storage capacitor SC disposed over the bit line BL, the parasitic capacitance is hardly increased.

Figure 21B:
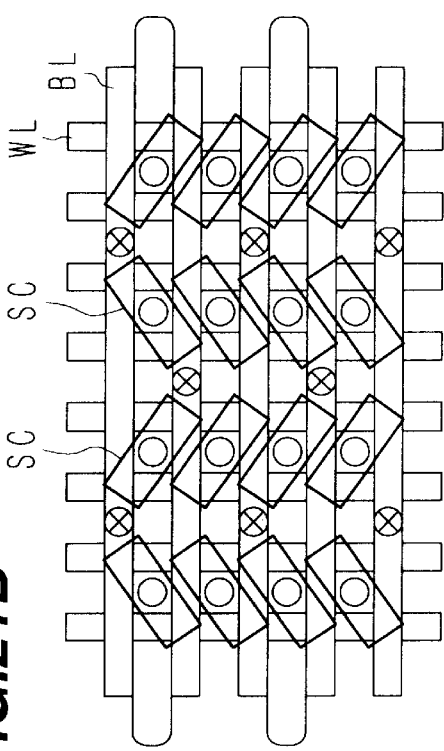

In the example shown in FIG. 21B, storage capacitors SC are disposed alternately in the right downward and left downward directions relative to the row direction. Disposing the storage capacitor SC obliquely to the bit line BL is similar to the example shown in FIG. 21A.

Figure 21C:
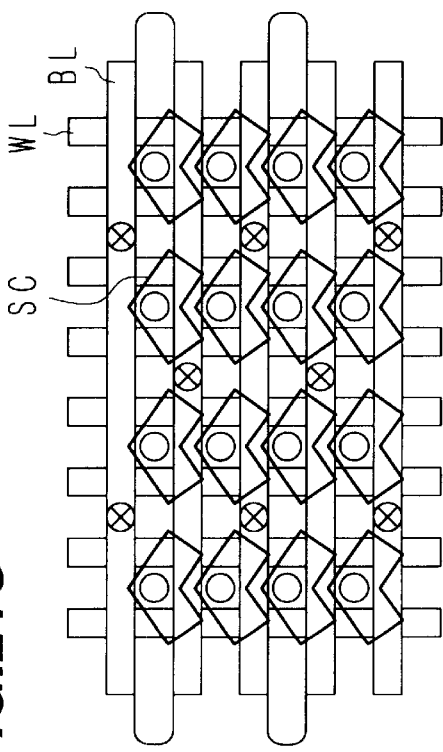

In the example shown in FIG. 21C, the plan shape of a storage capacitor is changed from a rectangle to a chevron. Also in this example, the area of the storage capacitor on the apex side of the chevron facing the bit line is reduced greatly and the total parasitic capacitance can be reduced.

Figure 21D:
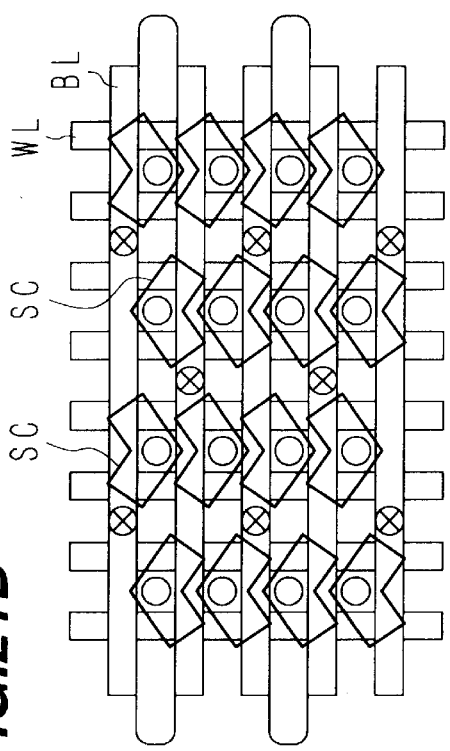

In the example shown in FIG. 21D, the apex side of the chevron is disposed alternately in the upward and downward directions. Also in this example, the area of the storage capacitor on the apex side of the chevron facing the bit line is reduced and the total parasitic capacitance can be reduced.

Figure 22A:
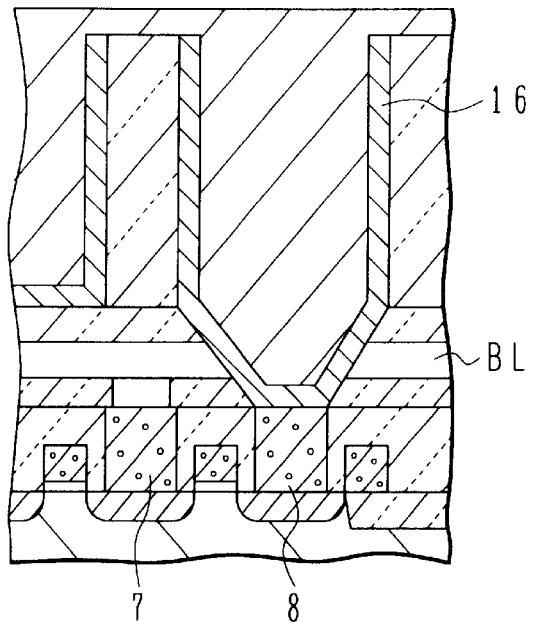
FIGS. 22A to 22D are cross sectional views illustrating the structure and manufacture method of a semiconductor memory device according to another embodiment of the invention.
Figure 22B:
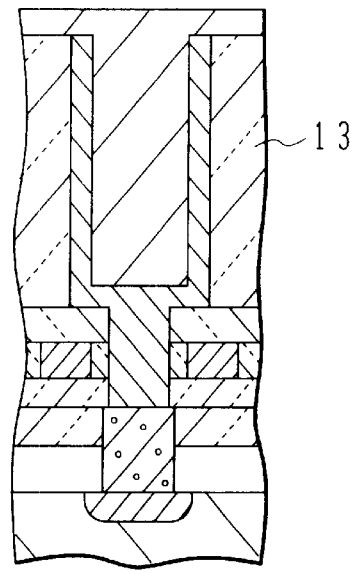

FIGS. 22A and 22B show the structure of a storage electrode having a lower tapered portion. FIG. 22A is a cross sectional view taken along the longer side direction, and FIG. 22B is a cross sectional view taken along the shorter side direction. The width of a storage electrode 16 in the bit line direction (width in the longer side direction) gradually narrows in the direction parallel to the bit line BL, down to the lower plug 8. The width of the storage electrode 16 in the word line direction (width in the shorter side direction) is not made narrow down to the lower plug 8. Since the storage electrode 16 has the lower tapered portion only in the longer side direction, a contact to the lower plug 8 is established with a minimum necessary area and the upper width of the storage electrode is enough to form a necessary capacitance.

As compared to a storage electrode 16 reaching the lower plug 8 without changing its width, the area of the storage electrode facing the bit line BL can be narrowed and the parasitic capacitance can be reduced. It is also possible to reduce a danger such as an electric short circuit to be formed by a contact of the storage electrode with a conductive material other than the plug by position misalignment of an exposure process. An additional position alignment margin can be obtained. If a taper having an angle same as the taper in the longer side direction is formed also in the shorter side direction, the shorter side of the storage electrode is shortened further and a sufficient contact area with the lower plug 8 cannot be obtained. It is therefore important to form the taper only in the longer side direction.

In the above embodiments, the layout of bit and word lines crossing at a right angle has been described. Some layouts of DRAM have bit and word lines crossing obliquely. Also in this case, if one side of a storage electrode and a bit line are disposed obliquely, the effects similar to those described above can be obtained.

Figure 22C:
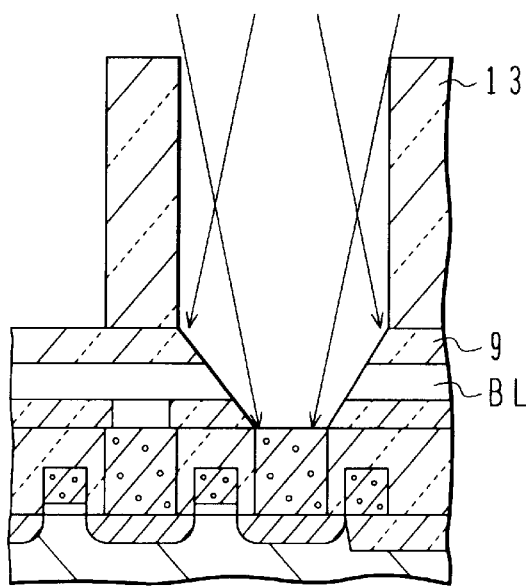
Figure 22D:
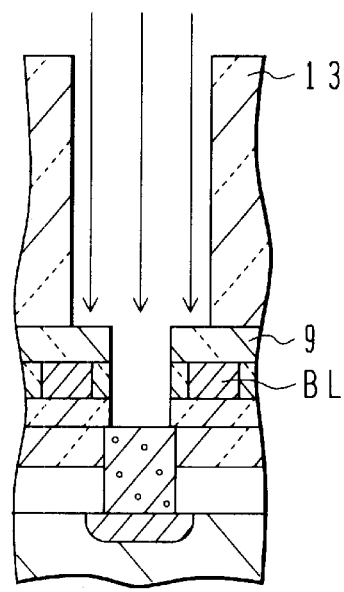
Figure 23B:
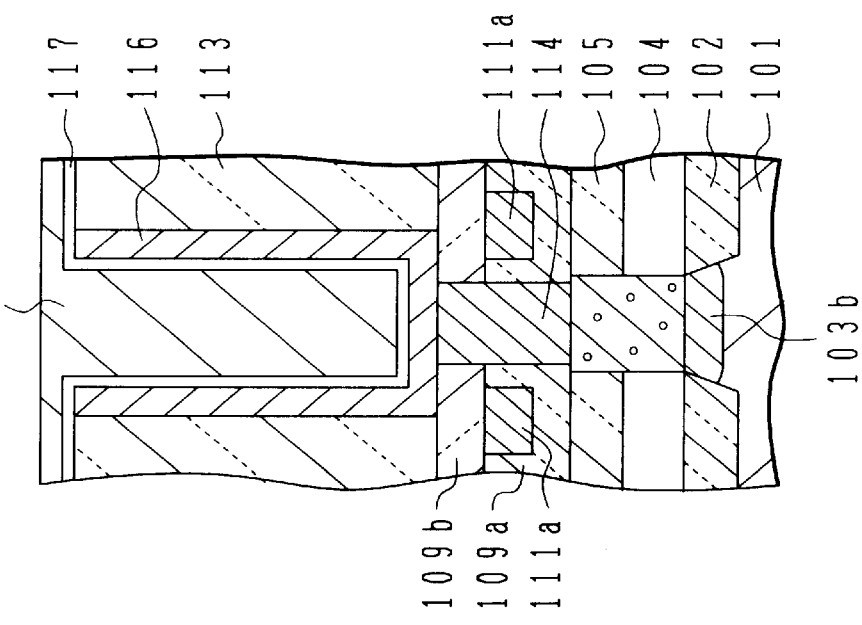
FIGS. 23A and 23B are cross sectional views showing an example of a DRAM structure according to conventional techniques.
Figure 23A:
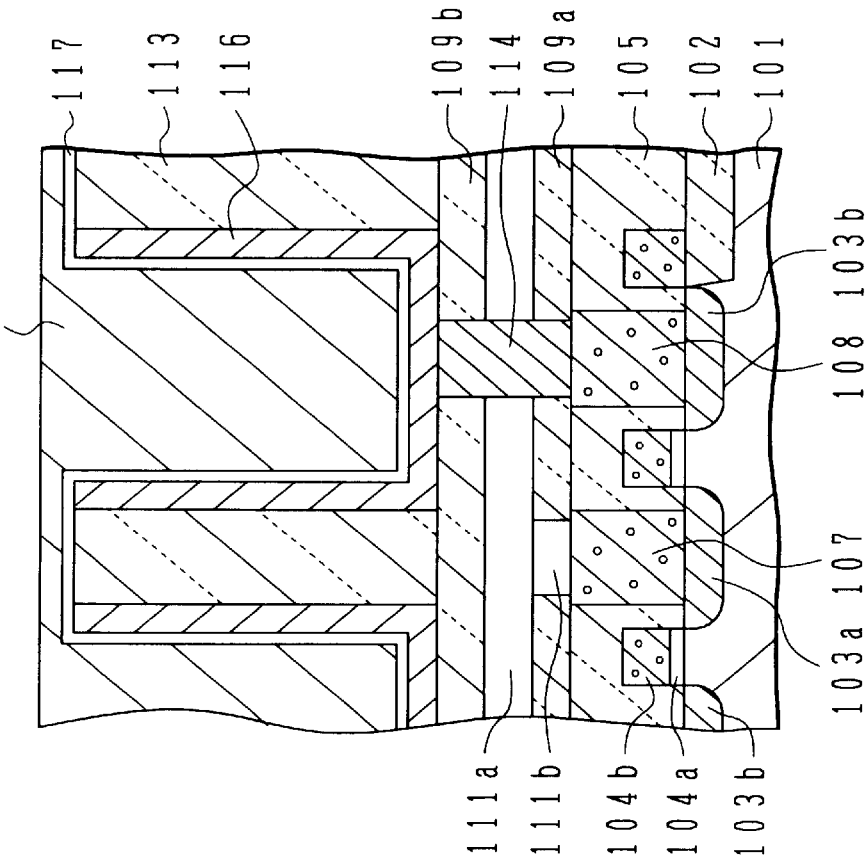

FIGS. 22C and 22D illustrate an example of a method of forming such a tapered portion.

FIG. 22C is a cross sectional view taken along a direction parallel to the bit line BL. With this method, an ion incidence direction is swung in a direction parallel to the bit line during an etching process for forming a storage electrode hole.

During the period while an insulating film 13 is etched, a vertical side wall is formed by implanting plasma generally vertically. After an interlayer insulating film 9 is exposed, the ion incidence direction is swung in parallel to the bit line by slanting it right and left as viewed on the drawing sheet. An etching speed in the area where ions are injected from both directions can therefore be increased, whereas an etching speed in the area where ions are injected only from one direction can therefore be decreased.

The ion incidence direction may be changed by continuously swinging it or by switching between radiations at two or more predetermined angles. This method first forms the vertical wall and then forms the taper. Conversely, the storage electrode hole may be formed by first forming a taper and then performing a vertical etching process to move downward the first formed taper.

FIG. 22D is a cross sectional view taken along a direction perpendicular to the bit line BL. The ion incidence direction is swung only in one direction and is not swung in the direction perpendicular to this one direction. Therefore, in the area between bit lines BL, a vertical side wall parallel to the bit line is formed.

The present invention has been described in connection with the preferred embodiments. The invention is not limited only to the above embodiments. It is apparent that various modifications, improvements, combinations, and the like can be made by those skilled in the art.

What is claimed is:

1. A method of manufacturing a semiconductor device, comprising the steps of:
   (a) forming an interlayer insulating film over a semiconductor substrate
   (b) forming a first mask on the interlayer insulating film, the first mask having a plurality of stripe patterns parallel to a first direction, and etching the interlayer insulating film from a surface thereof to a first intermediate depth to form grooves; and
   (c) forming a second mask on the resulting interlayer insulating film, the second mask having a plurality of stripe patterns parallel to a second direction crossing the first direction, and etching the interlayer insulating film through the remaining thickness thereof in the area of the grooves and not covered with the second mask to form openings, and in an area other than the area of the grooves, and not covered with the second mask, to form second grooves reaching a second intermediate depth from a surface of the interlayer insulating film, the second intermediate depth being substantially equal to said remaining thickness.

2. A method of manufacturing a semiconductor device according to claim 1, wherein said step (a) is a step of forming the interlayer insulating film including an etch stopper film, and said step (b) is a step of etching the interlayer insulating film down to the etch stopper film.

3. A method of manufacturing a semiconductor device, comprising the steps of:
   (a) forming an interlayer insulating film over a semiconductor substrate;
   (b) forming a first mask on the interlayer insulating film, the first mask having a plurality of stripe patterns parallel to a first direction, and etching the interlayer insulating film from a surface thereof to a first intermediate depth to form grooves;
   (c) forming a second mask on the resulting interlayer insulating film, the second mask having a plurality of stripe patterns parallel to a second direction crossing the first direction, and etching the interlayer insulating film through the remaining thickness thereof in the area of the grooves and not covered with the second mask to form openings, and in an area other than the area of the grooves, and not covered with the second mask, to form second grooves reaching a second intermediate depth from a surface of the interlayer insulating film; and
   (d) retracting the second mask after step (c).

4. A method of manufacturing a semiconductor device according to claim 3, further comprising the steps of:
   (e) forming a first conductive wire filling the openings and filling a space from a bottom of said first grooves to the second intermediate depth;
   (f) forming a mask layer filling a space above the first conductive wire in the first grooves and the second grooves, an upper surface of the mask layer being flush with the surface of the interlayer insulating film; and
   (g) by using the mask layer as a mask, etching the interlayer insulating film not covered with the mask layer to form holes.

5. A method of manufacturing a semiconductor device according to claim 4, further comprising the steps of:
   (h) forming an insulating film on the interlayer insulating film;
   (i) forming a third mask on the insulating film, the third mask having openings surrounding an area corresponding to the holes;
   j) etching the insulating film and the interlayer insulating film by using the third mask to form openings having a step; and
   (k) forming a conductive layer in the openings with the step.

* * * * *